United States Patent
Pang et al.

(10) Patent No.: US 9,911,500 B2
(45) Date of Patent: Mar. 6, 2018

(54) DUMMY VOLTAGE TO REDUCE FIRST READ EFFECT IN MEMORY

(71) Applicant: SanDisk Technologies Inc., Plano, TX (US)

(72) Inventors: Liang Pang, Fremont, CA (US); Pao-ling Koh, Fremont, CA (US); Jiahui Yuan, Fremont, CA (US); Charles Kwong, Redwood City, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/131,392

(22) Filed: Apr. 18, 2016

(65) Prior Publication Data

US 2017/0301403 A1     Oct. 19, 2017

(51) Int. Cl.
| | |
|---|---|
| *G11C 16/06* | (2006.01) |
| *G11C 16/28* | (2006.01) |
| *G11C 16/10* | (2006.01) |
| *G11C 16/26* | (2006.01) |

(Continued)

(52) U.S. Cl.
CPC .......... *G11C 16/28* (2013.01); *G11C 16/0483* (2013.01); *G11C 16/10* (2013.01); *G11C 16/26* (2013.01); *G11C 16/3436* (2013.01)

(58) Field of Classification Search
CPC ............ G11C 16/0483; G11C 16/3459; G11C 11/5642; G11C 11/5628; G11C 16/10; G11C 2211/5621; G11C 16/24; G11C 16/26; G11C 16/28; G11C 16/3418; G11C 16/3427; G11C 16/3454; G11C 2211/5641; G11C 29/04

USPC ........... 365/185.17, 185.22, 185.03, 185.21, 365/185.18, 185.12, 185.09, 185.11, 365/185.19, 185.2, 185.23, 185.28
See application file for complete search history.

(56) References Cited

U.S. PATENT DOCUMENTS

| | | |
|---|---|---|
| 8,199,567 B2 | 6/2012 | Chang-Wook et al. |
| 8,432,733 B2 | 4/2013 | Higashitani |
| 8,482,986 B2 | 7/2013 | Yamada |

(Continued)

OTHER PUBLICATIONS

Cai, Yu, et al., "Threshold Voltage Distribution in MLC NAND Flash Memory: Characterization, Analysis, and Modeling," Proceedings of the Conference on Design, Automation and Test, Mar. 2013, 6 pages.

*Primary Examiner* — Thong Q Le

(74) *Attorney, Agent, or Firm* — Vierra Magen Marcus LLP

(57) ABSTRACT

Techniques are provided for improving the accuracy of read operations of memory cells, where the threshold voltage (Vth) of a memory cell can shift depending on when the read operation occurs. In one aspect, a dummy voltage is applied to the word lines to cause a coupling up of the word lines and weak programming. This can occur when a specified amount of time has elapsed since a last program or read operation, or when a power on event is detected for the memory device. A number of read errors can also be considered. The dummy voltage is similar to a pass voltage of a program or read operation but no sensing is performed. The word line voltages are therefore provided at a consistently up-coupled level so that read operations are consistent. The coupling up occurs due to capacitive coupling between the word line and the channel.

29 Claims, 21 Drawing Sheets

(51) Int. Cl.
*G11C 16/04* (2006.01)
*G11C 16/34* (2006.01)

(56) References Cited

U.S. PATENT DOCUMENTS

| | | |
|---|---|---|
| 8,677,221 B2 | 3/2014 | Cornwell et al. |
| 8,902,668 B1 | 12/2014 | Dutta et al. |
| 9,007,814 B1 | 4/2015 | Derhacobian |
| 9,136,003 B1 | 9/2015 | Meir et al. |
| 9,230,663 B1 | 1/2016 | Lu et al. |
| 9,275,730 B2 | 3/2016 | Tortorelli et al. |
| 2011/0026331 A1* | 2/2011 | Dong ................ G11C 16/0483 365/185.19 |
| 2011/0069529 A1 | 3/2011 | Srinivasan et al. |
| 2012/0287720 A1* | 11/2012 | Choi ..................... G11C 16/10 365/185.19 |
| 2014/0098593 A1 | 4/2014 | Calderoni et al. |

\* cited by examiner

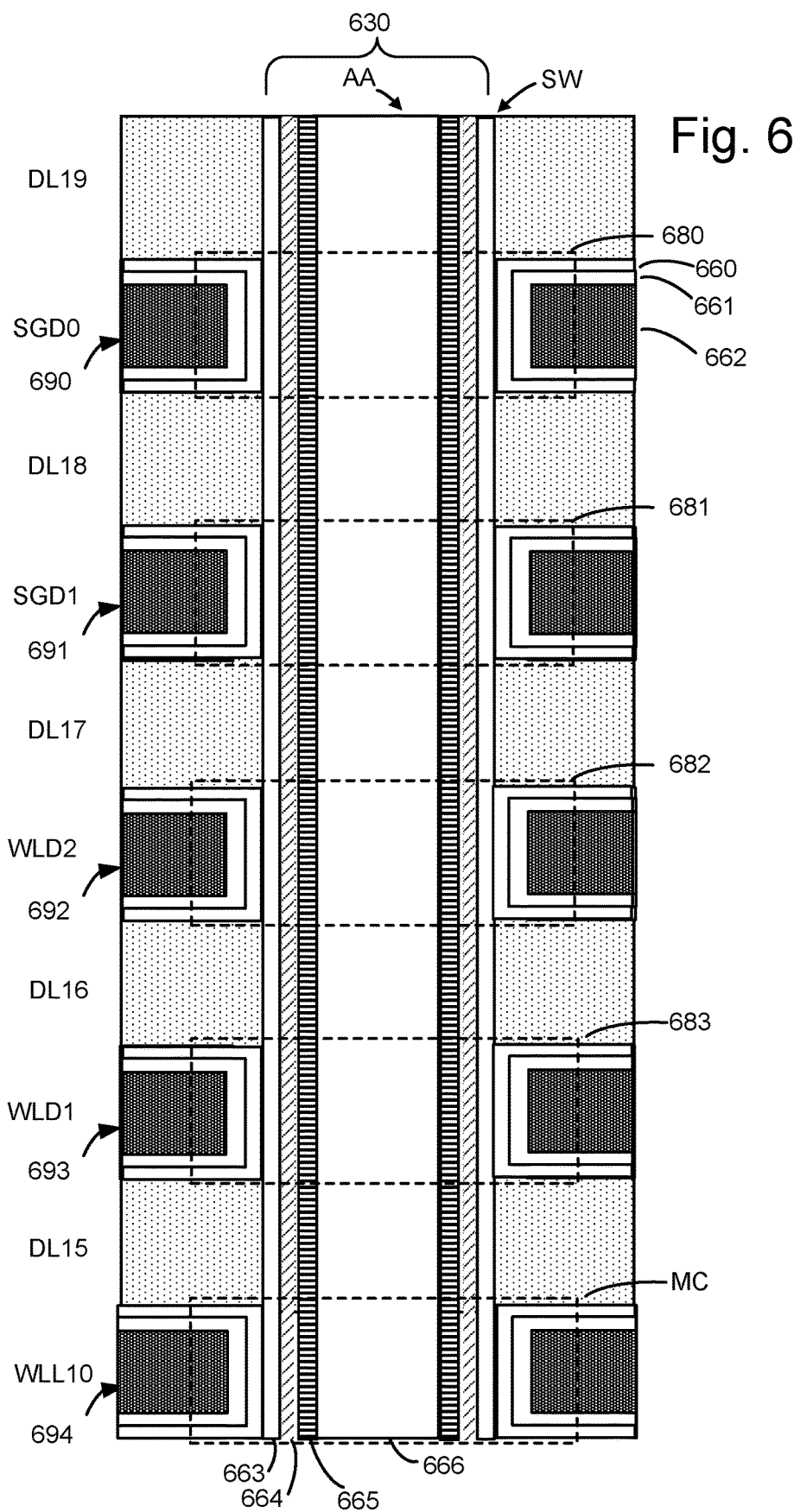

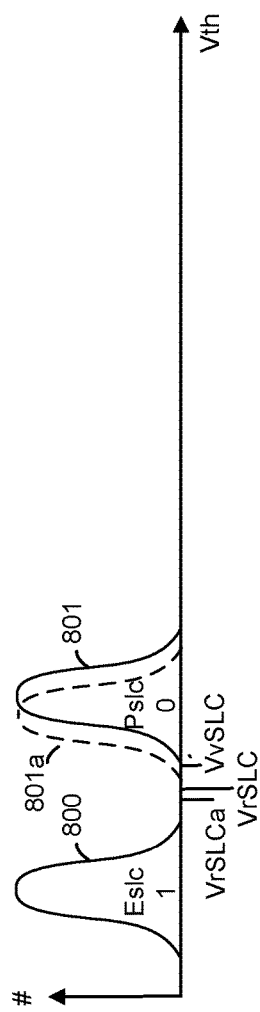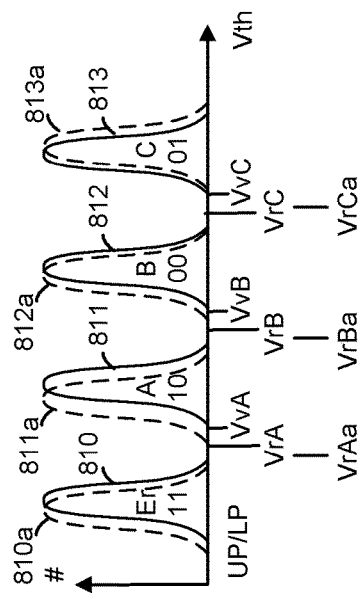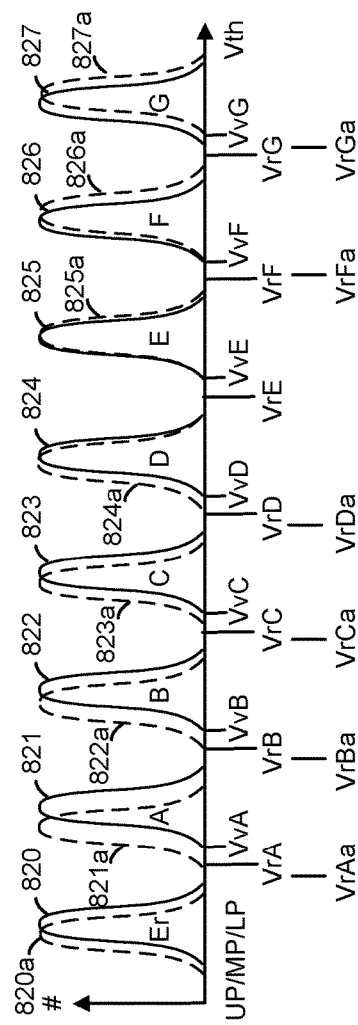

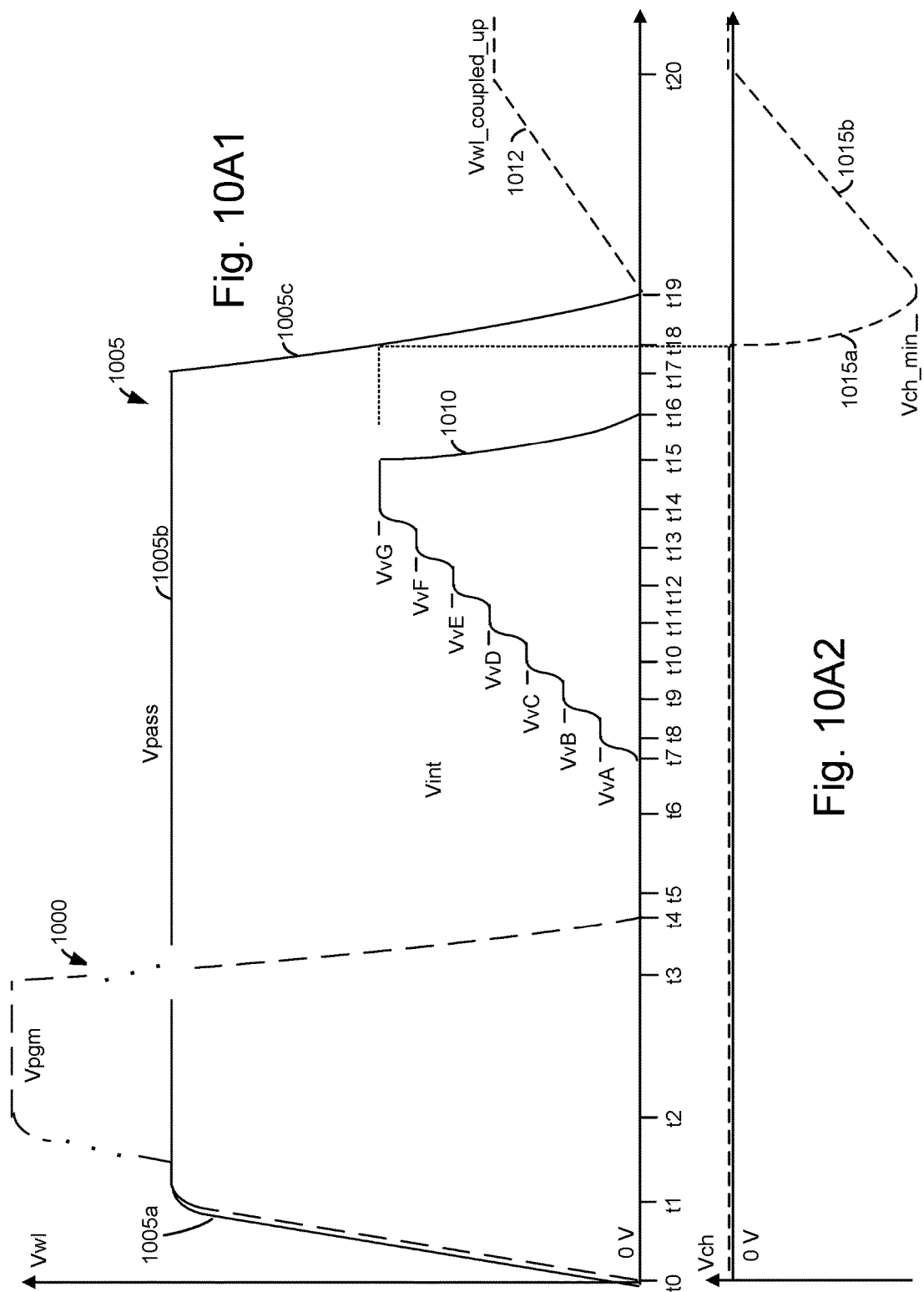

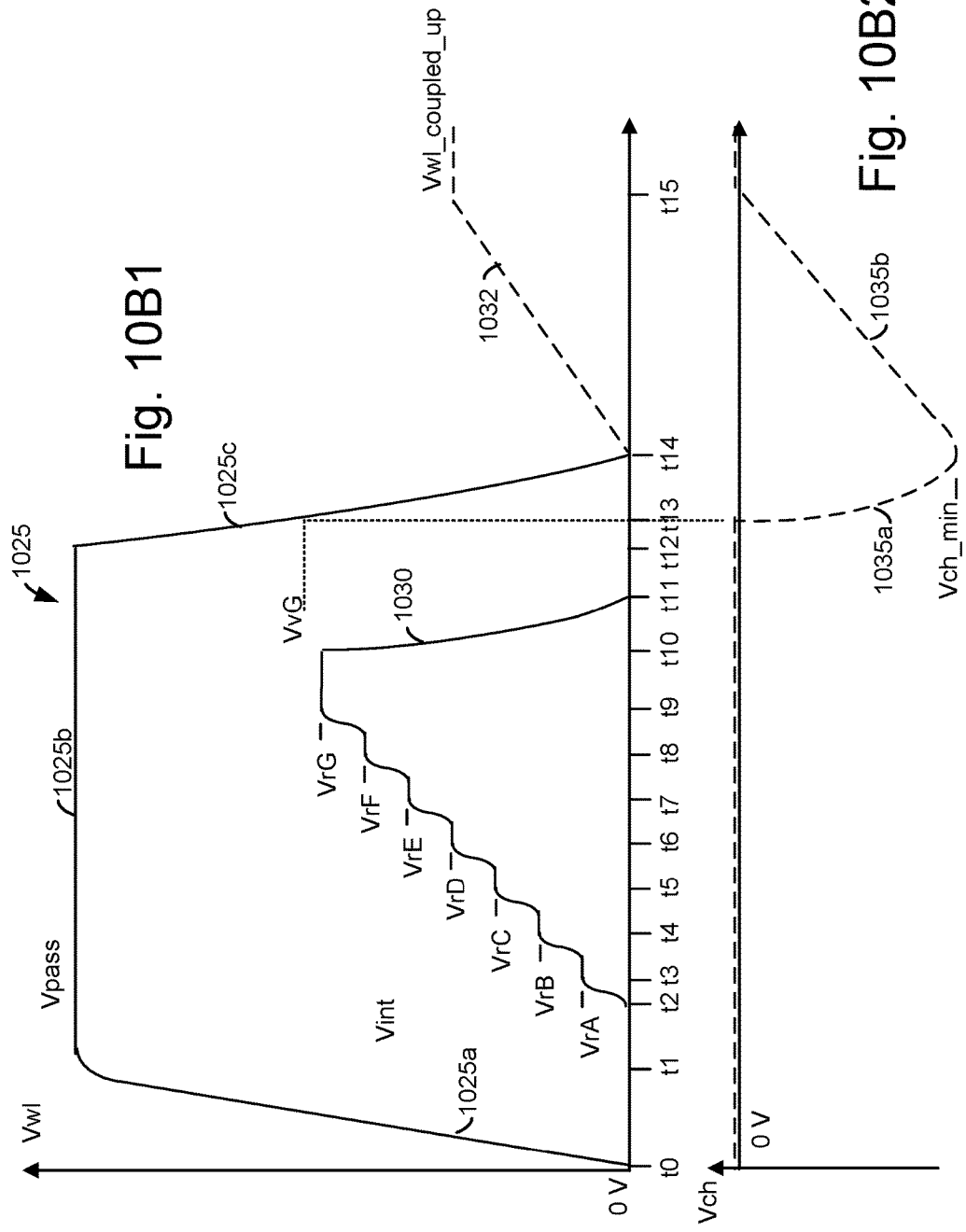

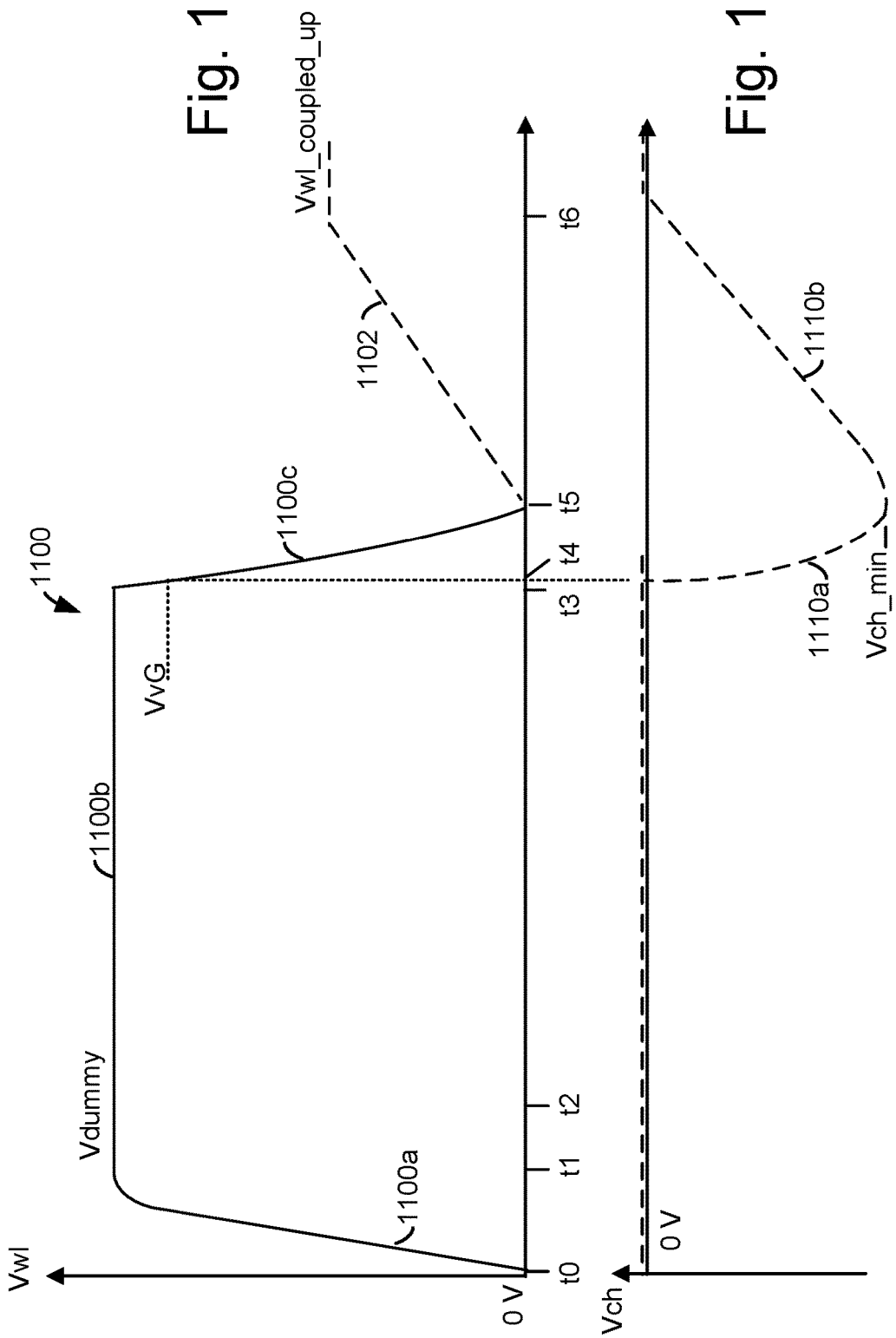

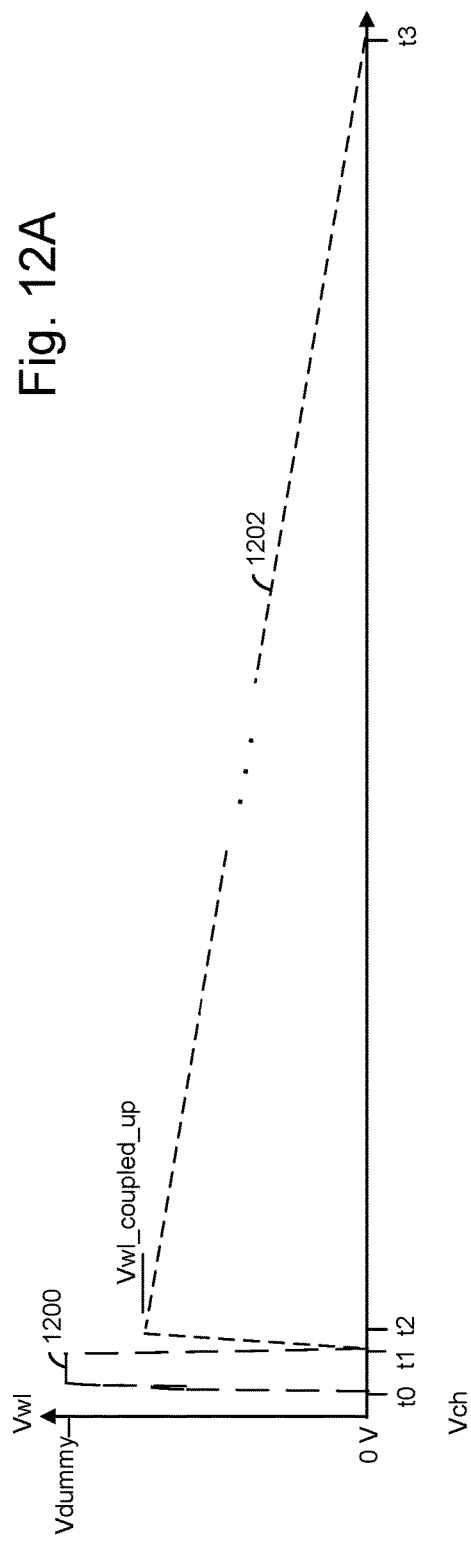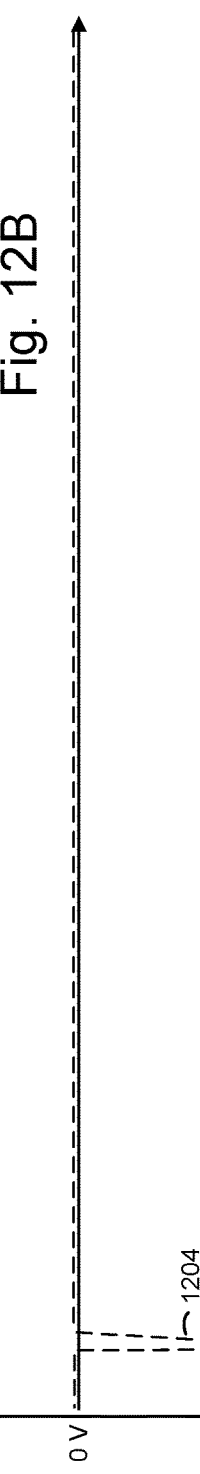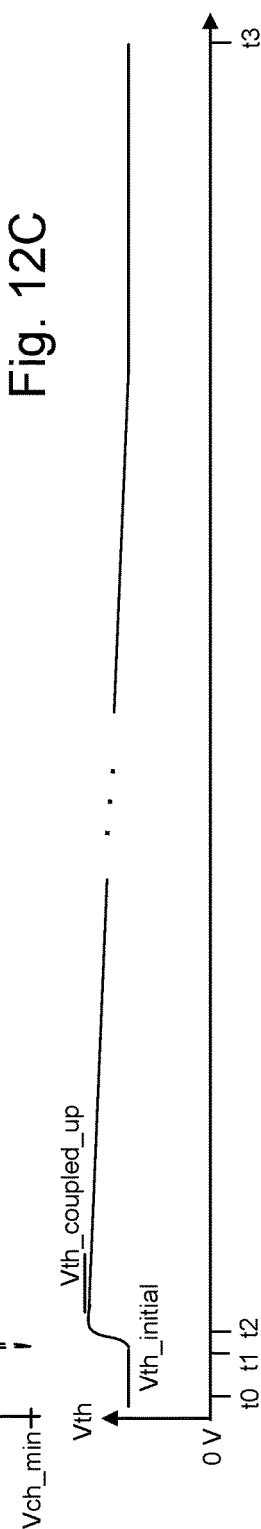

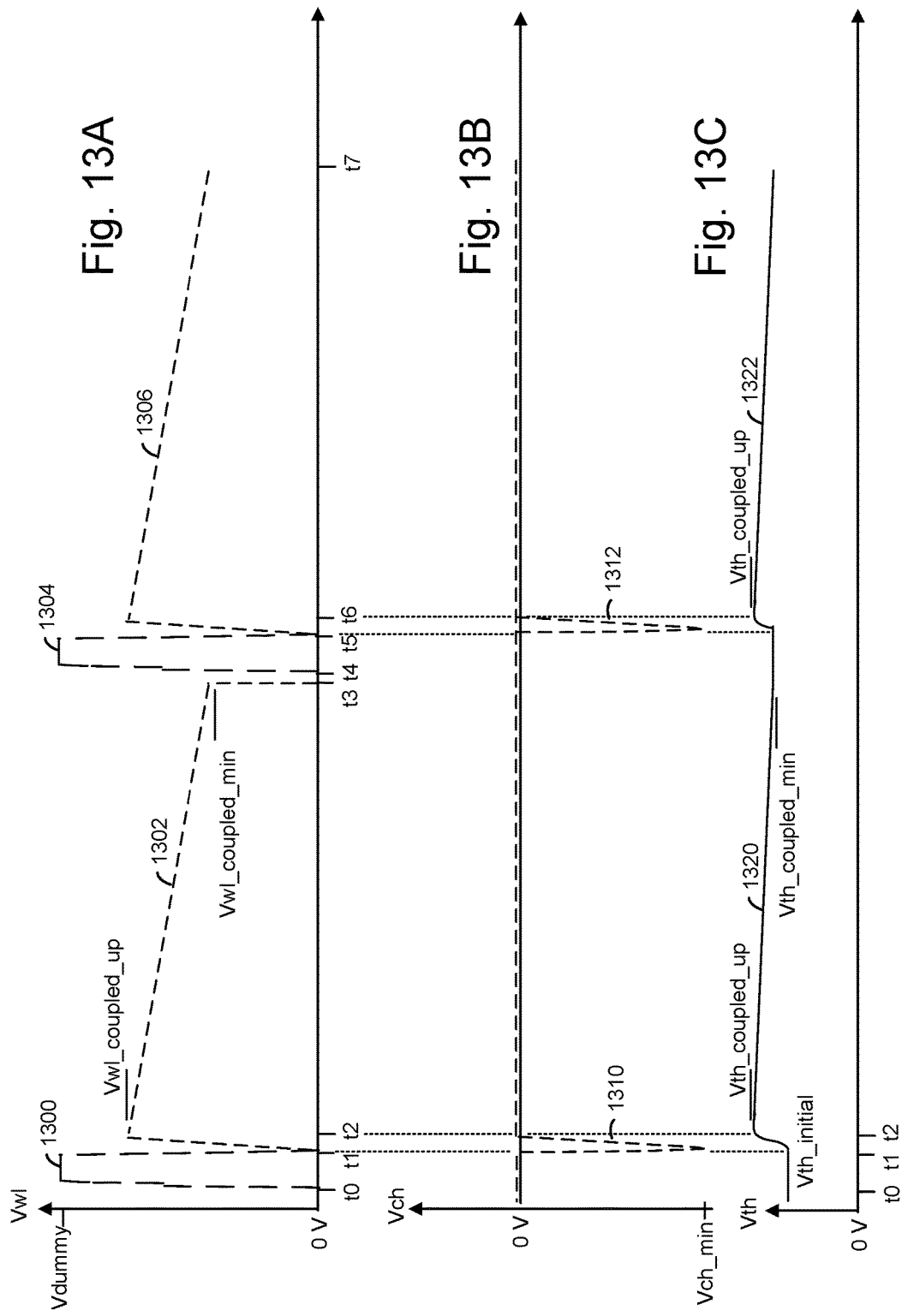

DUMMY VOLTAGE TO REDUCE FIRST READ EFFECT IN MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 6 depicts a close-up view of the region 622 of the stack of FIG. 4.

FIG. 8A depicts example Vth distributions of memory cells, where two data states are used, and a shift in Vth is observed.

FIG. 8B depicts example Vth distributions of memory cells, where four data states are used, and a shift in Vth is observed.

FIG. 8C depicts example Vth distributions of memory cells, where eight data states are used, and a shift in Vth is observed.

FIG. 10A1 depicts a plot of example waveforms in a programming operation.

FIG. 10A2 depicts a plot of a channel voltage (Vch) corresponding to FIG. 10A1.

FIG. 10B1 depicts a plot of example waveforms in a read operation.

FIG. 10B2 depicts a plot of a channel voltage (Vch) corresponding to FIG. 10B1.

FIG. 11A depicts a plot of an example dummy voltage of a word line and a subsequent coupled up voltage of the word line.

FIG. 11B depicts a plot of a channel voltage which is coupled down from a starting level and subsequently returns to the starting level, consistent with FIG. 11A.

FIG. 12A depicts a plot corresponding to the plot of FIG. 11A but showing a decay of the coupled up voltage of the word line over a longer time period.

FIG. 12B depicts a plot corresponding to the plot of FIG. 11B but showing the channel voltage over a longer time period, consistent with FIG. 12A.

FIG. 12C depicts a plot of a Vth of a memory cell connected to the coupled up word line, consistent with FIGS. 12A and 12B.

FIG. 13A depicts a plot corresponding to the plot of FIG. 11A but showing two instances of a dummy voltage of a word line and a subsequent coupled up voltage of the word line.

FIG. 13B depicts a plot showing a channel voltage, consistent with FIG. 13A.

FIG. 13C depicts a plot of a Vth of a memory cell connected to the coupled up word line, consistent with FIGS. 13A and 13B.

DETAILED DESCRIPTION

Techniques are provided for improving the accuracy of read operations in a memory device. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

Figure 9:
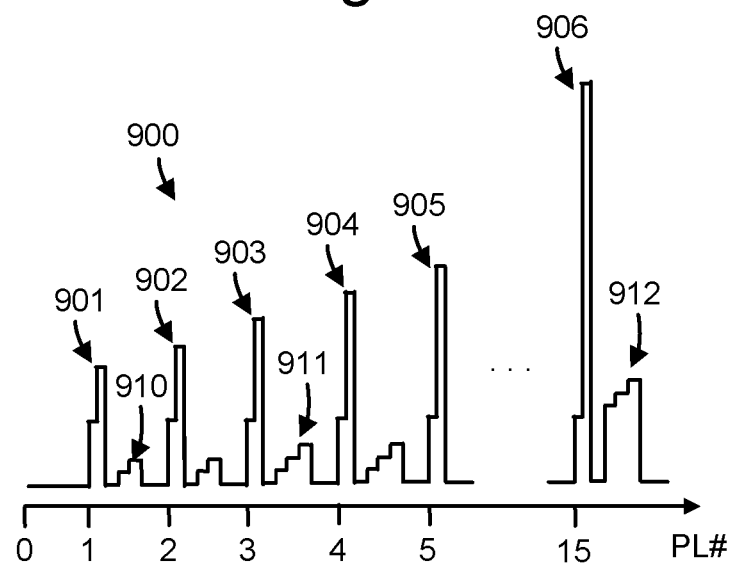
FIG. 9 depicts a waveform of an example programming operation.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state (Eslc) and the programmed state (Pslc) (see FIG. 8A). In a two-bit per cell memory device, there are four data states including the erased state and three higher data states referred to as the A, B and C data states (see FIG. 8B). In a three-bit per cell memory device, there are eight data states including the erased state and seven higher data states referred to as the A, B, C, D, E, F and G data states (see FIG. 8C). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 8D) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, it has been observed that the Vth of a memory cell can shift depending on when the read operation occurs. For example, a Vth upshift may be observed in some lower-state memory cells when the read operation occurs a relatively short time, e.g., seconds or minutes, after a programming operation or another read operation. The Vth can upshift due to weak programming of the cells after the cells are sensed in a programming operation or another read operation. The sensing of the cells involves the application of a sensing voltage (e.g., a read or verify voltage) to a selected word line. At the same time, a pass voltage is applied to the unselected word lines and stepped down. This step down temporarily reduces a channel voltage due to capacitive coupling. When the channel voltage increases back to its nominal level, this causes an increase in word line voltages, also due to capacitive coupling. The word lines at a coupled-up voltage can cause weak programming of the cells. However, the Vth gradually decreases as electrons which are trapped in the charge trapping material of the cells are de-trapped and return to the channel, e.g., over a period of time such as hours.

The Vth upshift may not be strong enough to program higher state memory cells.

Moreover, after a power on event, e.g., when the memory device is powered up for use, an operation may occur which checks for bad blocks. This operation involves setting the word lines to 0 V. As a result, any coupling up of the word line voltages is removed, along with the Vth upshift.

The situation in which the word lines are coupled up and the cells are weakly programmed can be considered to be a normal read situation since it occurs commonly. The read voltages can be set based on this normal read situation, also referred to as a coupled-up situation. This is reasonable because in practice, read operations will occur frequently in a memory device. The situation in which the word lines are not coupled up and the cells are not weakly programmed can be considered to be an abnormal or non-coupled up read situation. This situation occur can when the cells are first read a relatively long time after a previous program or read operation, or after a power on event, for example. This situation is referred to as a "first read" situation.

Techniques provided herein address the above and other issues. In one aspect, a dummy voltage is applied to the word lines to cause the couple up of the word lines and the weak programming. For example, this can occur when a specified amount of time has elapsed since a last program or read operation. The dummy voltage is a voltage which mimics the sensing voltage of a program or read operation and therefore has the same couple up effect on the word lines. However, no sensing operation need be performed during the dummy voltage so that time and power consumption penalties are minimized. The dummy voltage can also be applied when a power on event is detected. The word line voltages are floated a specified time after the step down of the dummy voltage.

Various other features and benefits are described below.

Figure 1:
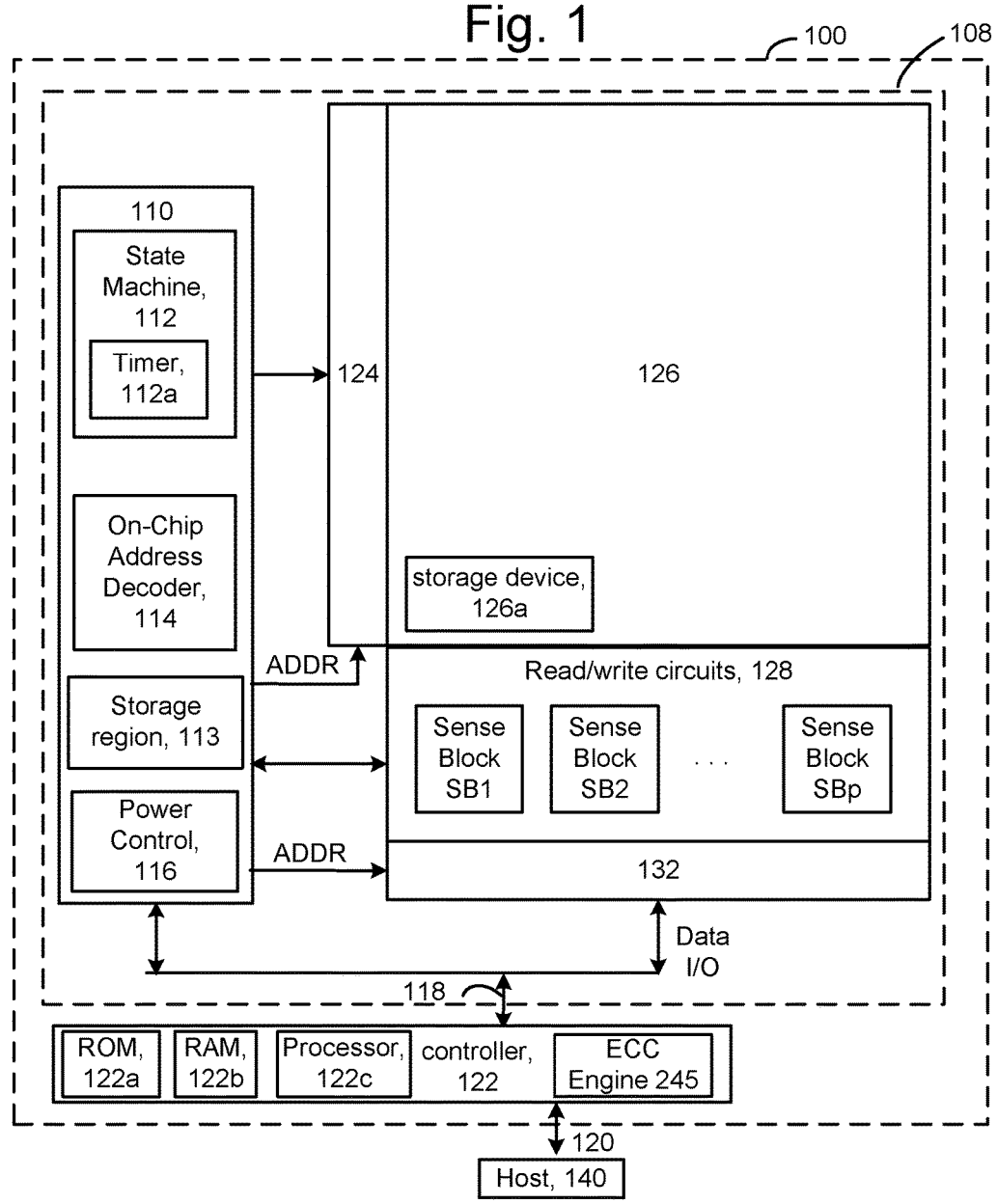
FIG. 1 is a block diagram of an example memory device.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. The state machine may include a timer 112a to determine when to perform a coupling up of word lines, as discussed further below. The time can measure a time since a last sensing operation. A storage region 113 may be provided, e.g., for program and read parameters as described further below.

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIG. 16. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the flowcharts of FIG. 14A to 14E. For example, a control circuit may include any one of, or a combination of, control circuitry 110, state machine 112, decoders 114 and 132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. The ECC engine may be used to count of number of errors in a read operation and use this number to determine whether to perform a coupling up of word lines, as discussed further below.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2A:
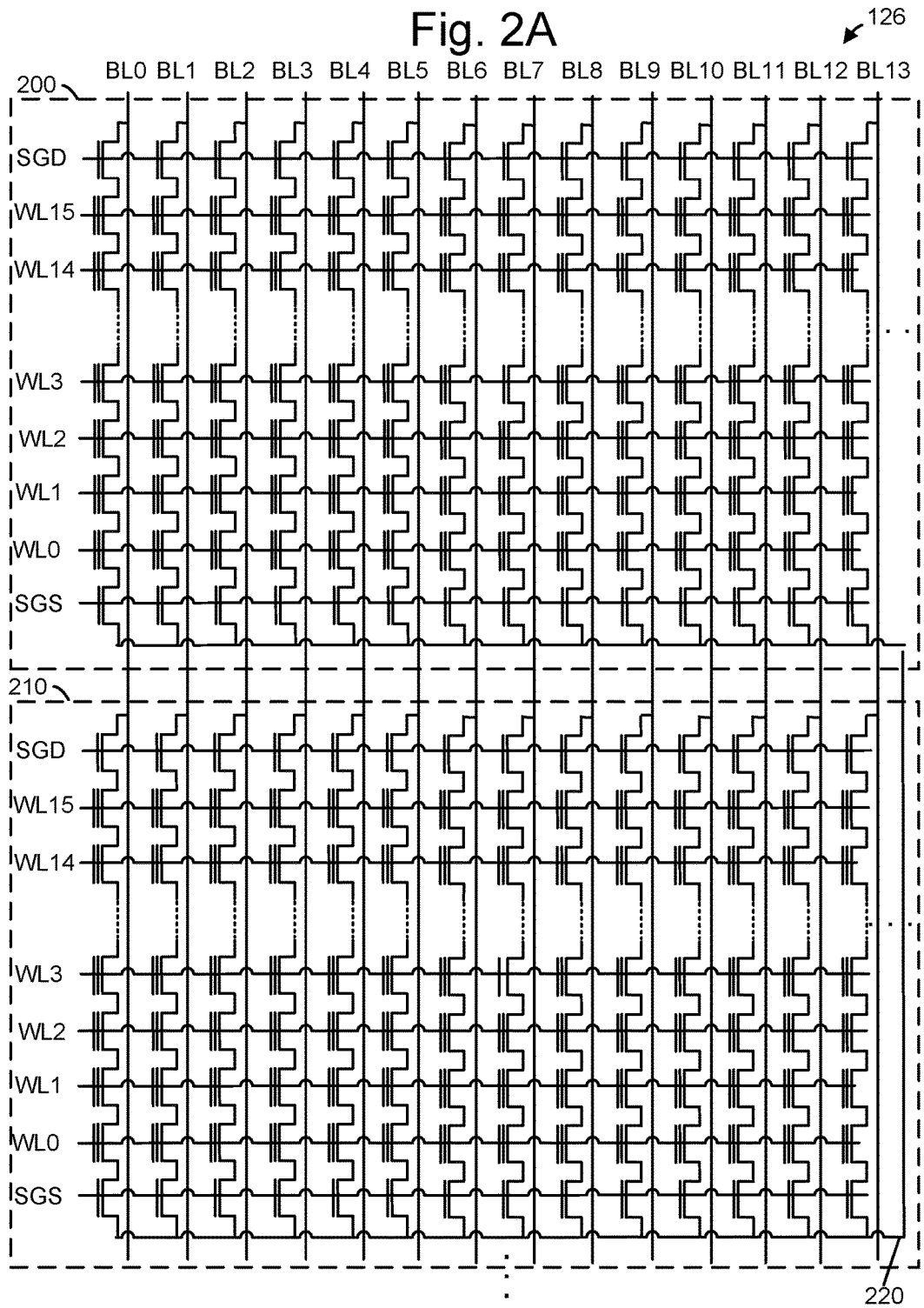
FIG. 2A depicts blocks of memory cells in an example 2D configuration of the memory structure 126 of FIG. 1.

FIG. 2A depicts blocks of memory cells in an example 2D configuration of the memory structure 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. Other types of non-volatile memory can also be used. For example, a charge-trapping memory cell may use a non-conductive dielectric material in place of a conductive floating gate to store charge in a non-volatile manner. In an example, a triple layer dielectric formed of silicon oxide, silicon nitride and silicon oxide ("ONO") is sandwiched between a conductive control gate and a semiconductor. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
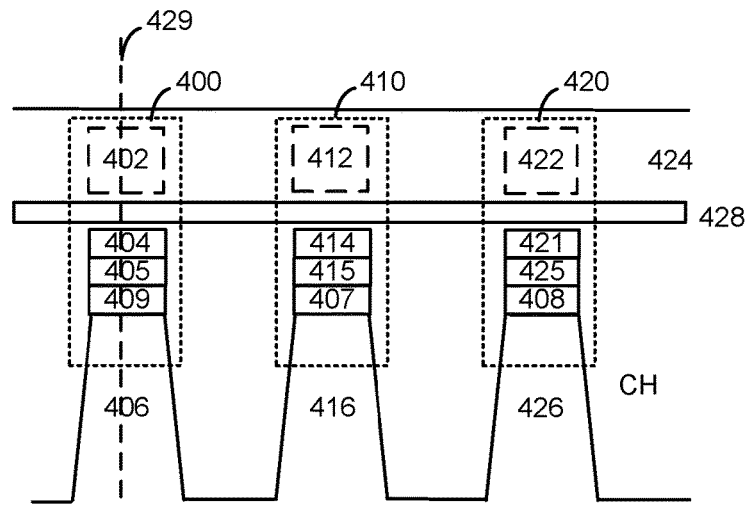
FIG. 2B depicts a cross-sectional view of example charge-trapping memory cells in NAND strings, as an example of memory cells in FIG. 2A.

FIG. 2B depicts a cross-sectional view of example charge-trapping memory cells in NAND strings, as an example of memory cells in FIG. 2A. The view is in a word line direction of memory cells comprising a flat control gate and charge-trapping regions as a 2D example of memory cells in the memory structure 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

One advantage of a flat control gate is that the charge-trapping layer can be made thinner than a floating gate. Additionally, the memory cells can be placed closer together.

Figure 2C:
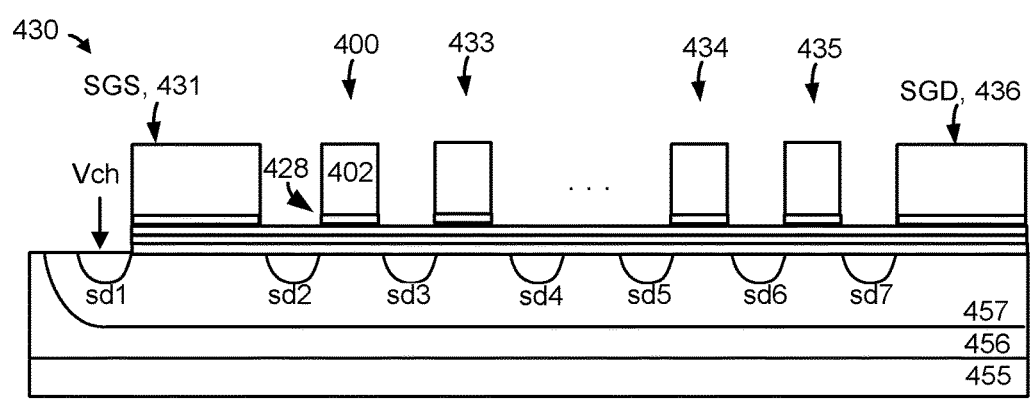
FIG. 2C depicts a cross-sectional view of the structure of FIG. 2B along line 429.

FIG. 2C depicts a cross-sectional view of the structure of FIG. 2B along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 2D:
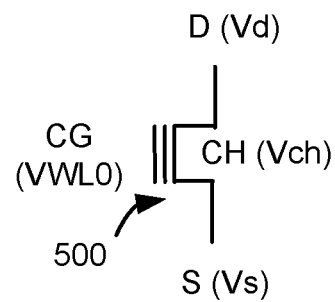
FIG. 2D depicts an example memory cell 500.

FIG. 2D depicts an example memory cell 500. The memory cell comprises a control gate CG which receives a word line voltage Vwl10, a drain at a voltage Vd, a source at a voltage Vs and a channel at a voltage Vch.

Figure 3:
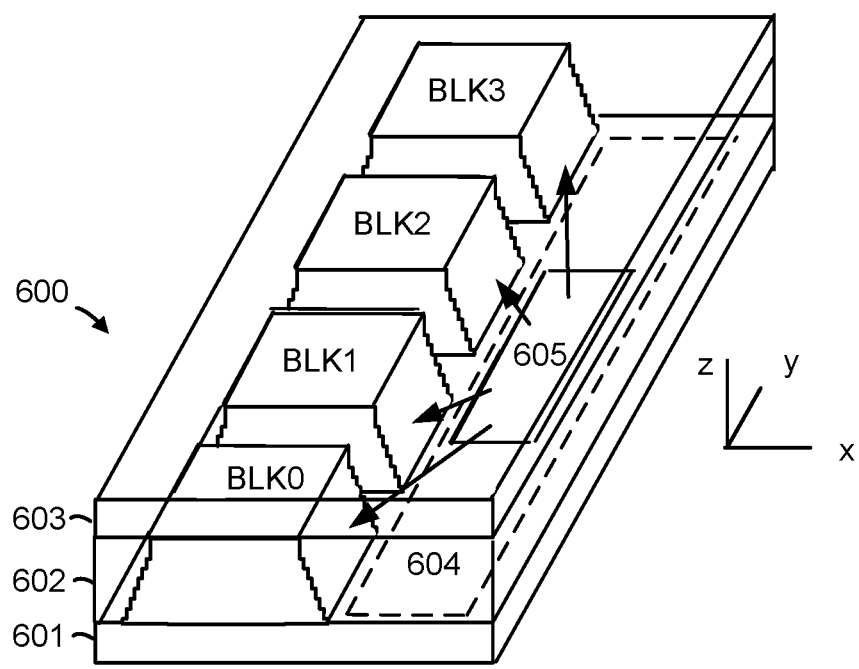
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
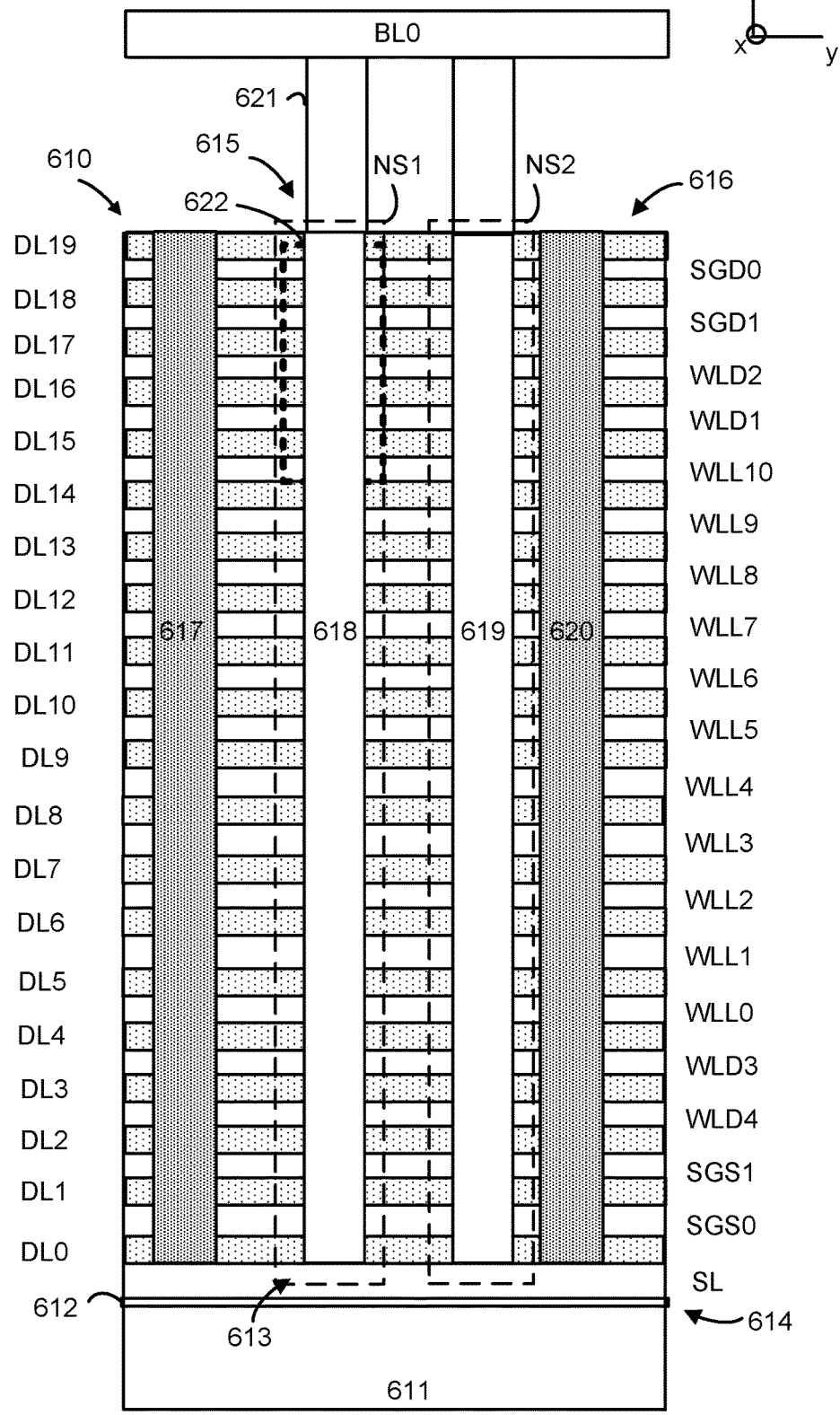
FIG. 4 depicts an example cross-sectional view of a portion of one of the blocks of FIG. 5.
Figure 5:
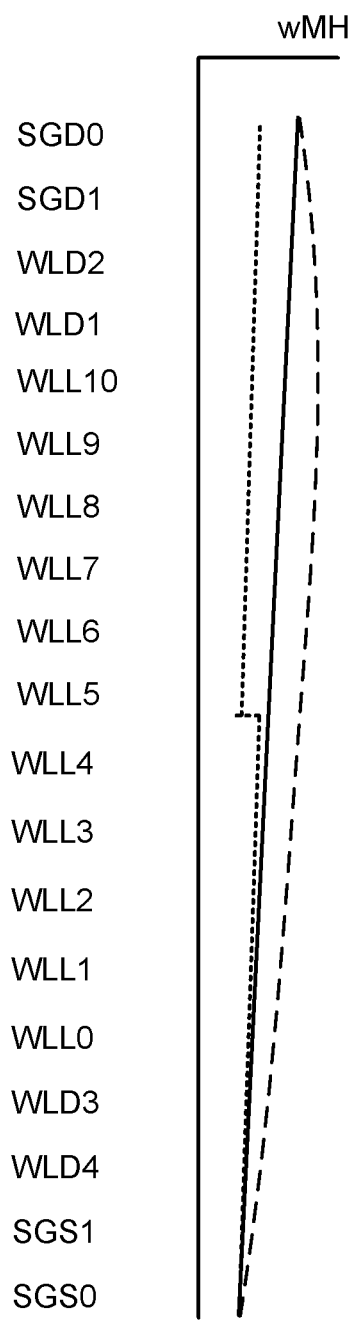
FIG. 5 depicts a plot of memory hole diameter in the stack of FIG. 4.

FIG. 4 depicts an example cross-sectional view of a portion of one of the blocks of FIG. 5. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

FIG. 5 depicts a plot of memory hole diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Due to the non-uniformity in the width of the memory hole, the programming and erase speed of the memory cells can vary based on their position along the memory hole, e.g., based on their height in the stack. With a smaller diameter memory hole, the electric field across the tunnel oxide is relatively stronger, so that the programming and erase speed is relatively higher.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer 663 or film such as SiN or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
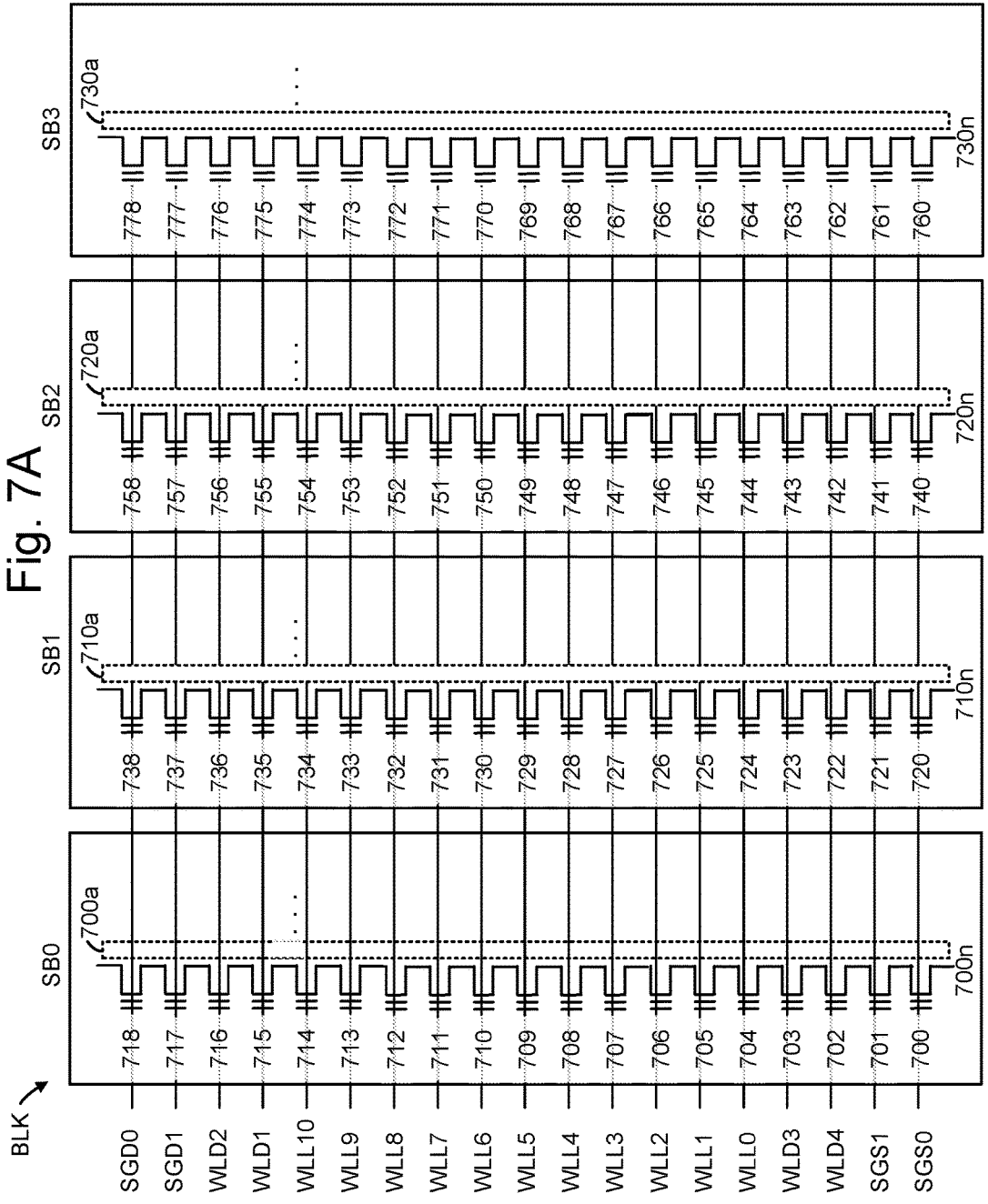
FIG. 7A depicts an example view of NAND strings in sub-blocks in a 3D configuration which is consistent with FIG. 4.

FIG. 7A depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channel regions 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

Figure 7B:
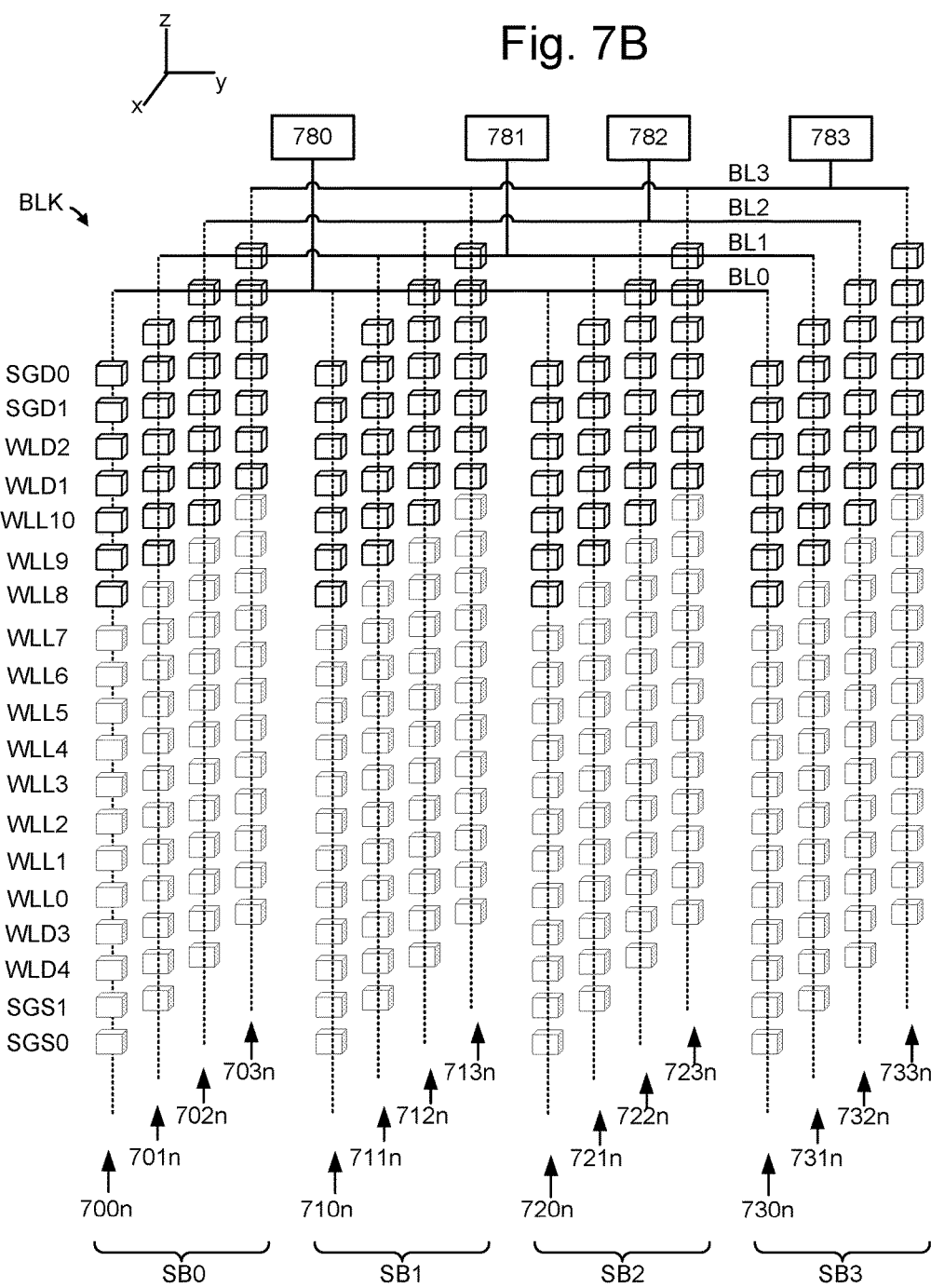
FIG. 7B depicts additional detail of the sub-blocks SB0-SB3 of FIG. 8A.

FIG. 7B depicts additional detail of the sub-blocks SB0-SB3 of FIG. 7A. Example memory cells are depicted which extend in the x direction along word lines in each sub-block.

Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3.

FIG. 8A depicts example Vth distributions of memory cells, where two data states are used, and a shift in Vth is observed. In FIG. 8A to 8C, the Vth distributions with a dashed line represent a first read situation and the Vth distributions with a solid line represent a normal read situation. Further, assume that the sensing of the programming is in a normal read situation.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

A Vth distribution 800 represents an erased state (Eslc), a Vth distribution 801 represents a programmed data state (Pslc) with a Vth upshift due to weak programming caused by a recent sensing operation, and a Vth distribution 801a represents Pslc without a Vth upshift, in an example of single-level cell (SLC) programming. In other words, the Vth distribution 801a has a downshift relative to the Vth distribution 801. The erased state may represent a one bit while the programmed state represents a zero bit, for example. A verify voltage for the programmed state is VvSLC and a read voltage for distinguishing between the two states is VrSLC in the normal read situation or VrSLCa in the first read situation. VrSLCa<VrSLC because the lower tail of the Vth distribution 801a is lower than the lower tail of the Vth distribution 801. Generally, a read voltage for distinguishing between adjacent states, e.g., a lower state and a higher state, should be located midway between the expected upper tail of the Vth distribution of the lower state and the expected lower tail of the Vth distribution of the higher state.

FIG. 8B depicts example Vth distributions of memory cells, where four data states are used, and a shift in Vth is observed. The data states are represented by Vth distributions for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB. In this example, the Vth distributions 810, 811 and 812 for the Er, A and B states, respectively, in the normal read situation have a Vth upshift due to weak programming caused by a recent sensing operation. The Vth distributions 810a, 811a and 812a in the first read situation do not have the Vth upshift. Further, the upshift for the A state is greater than for the B state. The Vth distribution 813 for the C state has a Vth downshift in the normal read situation compared to the Vth distribution 813a of the first read situation. For the higher states, the coupling up potential of the channel to the word line is typically not strong enough to trap more electrons in the charge trapping layer of a cell. This is due to a screening effect of the electrons which are already present in the charge trapping layer of the cell and provide the high Vth. Instead, the electrons in the charge trapping layer are more attracted towards the control gate, resulting in a Vth downshift for the normal read situation (e.g., when electrons move far away from the channel, Vth is reduced). Data retention effects may also be present for the higher states in which charge is lost from the charge trapping layer.

One option to address the Vth downshift is to allow the downshift to remain when a first read operation occurs and decrease the read voltage, as represented by VrAa<VrA and VrBa<VrB. Similarly, an option to address the lack of Vth downshift for the highest state (e.g., the C state in this example) is to increase the read voltage, as represented by VrCa>VrC. A baseline set of read voltages for a normal read situation thus includes VrA, VrB and VrC, and an adjusted set of read voltages for a first read situation includes VrAa, VrBa and VrCa.

FIG. 8C depicts example Vth distributions of memory cells, where eight data states are used, and a shift in Vth is observed. The verify voltages of the A, B, C, D, E, F and G states are VvA, VvB, VvC, VvD, VvE, VvF and VvG, respectively. A first set of read voltages for the A, B, C, D, E, F and G states includes VrA, VrB, VrC, VrD, VrE, VrF and VrG, respectively, for the normal read situation. A second set of read voltages for the A, B, C, D, E, F and G states includes VrAa, VrBa, VrCa, VrDa, VrE, VrFa and VrGa, respectively, for the first read situation, where VrAa<VrA, VrBa<VrB, VrCa<VrC, VrDa<VrD, VrFa>VrF and VrGa>VrG. For the A, B, C, D, E, F and G states, an example encoding of bits for each state is 111, 110, 100, 000, 010, 011, 001 and 101, respectively.

In this example, the Vth distributions 820, 821, 822, 823 and 824 for the Er, A, B, C and D states, respectively, have a Vth upshift due to weak programming caused by a recent sensing operation. The Vth distributions 820a, 821a, 822a, 823a and 824a for the Er, A, B, C and D states, respectively, do not have this Vth upshift. The Vth distributions 826 and 827 for the F and G states, respectively, have a Vth downshift, in the normal read situation. The Vth distributions 826a and 827a for the F and G states, respectively, do not have the Vth downshift. The Vth distributions 825 and 825a for the E state indicate essentially no Vth upshift or downshift.

One option to address the Vth downshift is to decrease the read voltage, as represented by VrAa, VrBa, VrCa and VrDa. Similarly, an option to address the lack of the Vth downshift is to increase the read voltage, as represented by VrFa and VrGa.

The memory cells may be programmed to different data states comprising one or more lower data states, e.g., A-D, one or more midrange data states, e.g., E, and one or more upper data states, e.g., F and G. A baseline set of read voltages, e.g., VrA, VrB, VrC, VrD, VrE, VrF and VrG, and an adjusted set of read voltages, e.g., VrAa, VrBa, VrCa, VrDa, VrE, VrFa and VrGa, may be provided. See also FIG. 8E. In response to a read command for a set of memory cells, if a time since a last sensing operation of the memory cells exceeds a specified time, or other triggering condition is met, the set of memory cells is read using the baseline set of read voltages. If the time since the last sensing operation of the memory cells does not exceed the specified time, or other triggering condition is not met, the set of memory cells is read using the adjusted set of read voltages.

In the adjusted set of read voltages, read voltages for the one or more lower data states, e.g., VrAa, VrBa, VrCa, VrDa are lower than in the baseline set of read voltages, e.g., VrA, VrB, VrC, VrD, respectively, and read voltages for the one or more upper data states, e.g., VrFa and VrGa, are higher than in the baseline set of read voltages, e.g., VrF and VrG, respectively.

Further, the different data states may comprise multiple lower data states and multiple upper data states. The read voltages for the multiple lower data states may be adjusted lower than in the baseline set of read voltages by different amounts, wherein a largest adjustment among the read voltages for the multiple lower data states is provided for a lowest data state (e.g., A) of the multiple lower data states, e.g., (VrA−VrAa)>((VrB−VrBa) or (VrC−VrCa) or VrD>VrDa). In another approach, the adjustment is progressively larger for the progressively lower states among the multiple lower data states, e.g., (VrA−VrAa)>(VrB−VrBa)>(VrC−VrCa)>(VrD>VrDa).

The adjusted read voltages can also be used with a dummy voltage to address shifts in Vth.

Similarly, read voltages for the multiple upper data states may be adjusted higher than in the baseline set of read voltages by different amounts, wherein a largest adjustment among the read voltages for the multiple upper data states is provided for a highest data state (e.g., G) of the multiple upper data states. e.g., (VrGa−VrG)>(VrFa−VrF). In another approach, the adjustment is progressively larger for progressively higher states among the multiple upper data states.

Figure 8D:
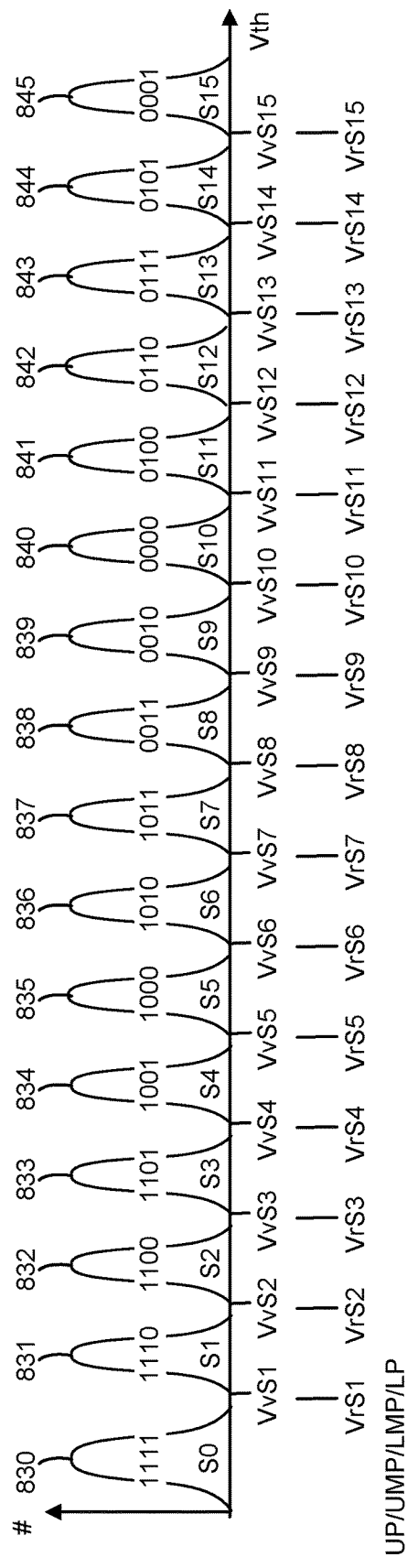
FIG. 8D depicts example Vth distributions of memory cells, where sixteen data states are used.

FIG. 8D depicts example Vth distributions of memory cells, where sixteen data states are used. Programming using four bits per cell (16 levels) can involve lower, lower-middle, upper-middle and upper pages.

The data states are represented by Vth distributions 830, 831, 832, 833, 834, 835, 836, 837, 838, 839, 840, 841, 842, 843, 844 and 845 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS4 and VrS15. The Vth distributions are read voltages are for a normal read situation. The read voltages can be adjusted for a first read situation as discussed.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

Figure 8E:
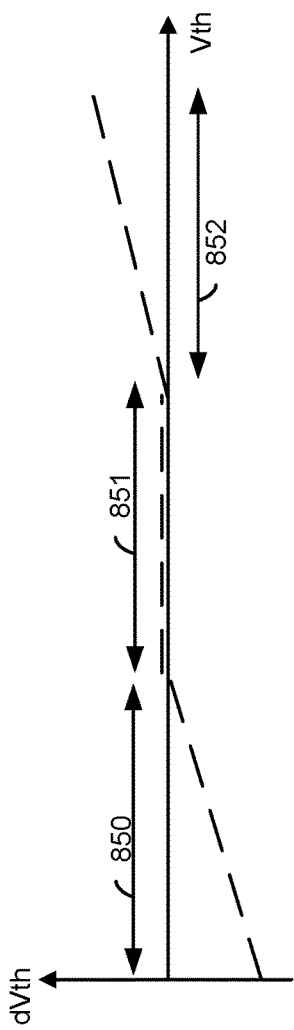
FIG. 8E depicts a plot of a change in Vth (dVth) on a vertical axis versus a Vth of cells in different data states on a horizontal axis.

FIG. 8E depicts a plot of a change in Vth (dVth) on a vertical axis versus a Vth of cells in different data states on a horizontal axis. As mentioned, in a first read situation, a Vth downshift may be seen for lower states, essentially no change in Vth may be seen in midrange states, and a Vth upshift may be seen for upper states, as represented by arrows 850, 851 and 852, respectively.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIG. 8A-8D.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

FIG. 10A1 depicts a plot of example waveforms in a programming operation. The time period shown represents one program-verify iteration. The horizontal axis depicts time and the vertical axis depicts word line voltage, Vwl. A program voltage 1000 is applied to a selected word line from t0-t4 and reaches a magnitude of Vpgm. A pass voltage 1005 is applied to the unselected word lines from t5-t19 and reaches a magnitude of Vpass, which is sufficiently high to provide the cells in a conductive state so that the sensing (e.g., verify) operations can occur for the cells of the selected word line. The pass voltage includes an increasing portion 1005a, a fixed amplitude portion 1005b, for instance, at Vpass and a decreasing portion 1005c. The program voltage can temporarily pause at an intermediate level such as Vpass to avoid a single large transition which can have undesired coupling effects. Optionally, the pass voltage may be increased sooner so that Vpass is reached by t0.

A verify voltage 1010 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The waveform decreases from VvG to 0 V or other steady state level from t15-t16.

For the unselected word lines, the decrease in Vpass will cause the cells to transition from a conductive state to a non-conductive state. In particular, when the Vpass falls below the Vth of a cell, the channel of the cell will become cutoff, e.g., the cell will become non-conductive. The dotted line at t18 indicates when a cell with Vth=VvG becomes non-conductive. When a cell becomes non-conductive, it acts as a capacitor in which the control gate is one plate and the channel is another plate. As the pass voltage 1005 decreases from VvG to 0 V, the channel is capacitively coupled down by a similar amount, as represented by a dashed line 1015a in FIG. 10A2.

The plot 1012 is shown increasing relatively quickly but this is not to scale. In practice, the read operation, e.g., from t5-t19, may consume about 100 microseconds, while the coupling up of the word line may be significantly longer, in the millisecond range such as 10 milliseconds.

FIG. 10A2 depicts a plot of a channel voltage (Vch) corresponding to FIG. 10A1. The channel is capacitively coupled down to a minimum level of Vch_min from t18-t19 and then begins to return to its original, starting level of, e.g., 0 V from t19-t20. The voltages of the word lines are allowed to float starting at t19, so that the voltages (plot 1012) are capacitively coupled higher by the increase in Vch (plot 1015b). The voltages of the word lines float to a peak level of Vwl_coupled_up. For example, VvG may be 5 V, so that there is a 5 V change in the word line voltage, e.g., 5-0 V, which is coupled to the channel. Vch_min may be about −5 V in this example. There is a 5 V increase in Vch which is coupled to the word line, e.g., control gate, of the cells. Vwl_coupled_up may be about 4 V.

FIG. 10B1 depicts a plot of example waveforms in a read operation. A read operation is similar to a verify operation as both are sensing operations and both provide a coupling up of the word lines.

The horizontal axis depicts time and the vertical axis depicts word line voltage, Vwl. A pass voltage 1025 is applied to the unselected word lines from t0-t14 and reaches a magnitude of Vpass. The pass voltage includes an increasing portion 1025a, a portion 1025b at Vpass and a decreasing portion 1025c. A read voltage 1030 is applied to the selected word line. In this example, all seven read voltages are applied, one after another. An eight-level memory device is used in this example. Read voltages of VrA, VrB, VrC, VrD, VrE, VrF and VrG are applied at t3, t4, t5, t6, t7, t8 and t9, respectively. The waveform decreases from VrG to 0 V from t10-t11.

For the unselected word lines, the decrease in Vpass will cause the cells to transition from a conductive state to a non-conductive state, as discussed. The dotted line at t13 indicates when a cell with Vth=VvG becomes non-conductive. As the pass voltage 1025 decreases from VvG to 0 V, the channel is capacitively coupled down by a similar amount, as represented by a dashed line 1035a in FIG. 10B2.

FIG. 10B2 depicts a plot of a channel voltage (Vch) corresponding to FIG. 10B1. The channel is capacitively coupled down to a minimum level of Vch_min from t13-t14 and then begins to return to its original, starting level of, e.g., 0 V from t14-t15. The voltages of the word lines are allowed to float starting at t14, so that the voltages (plot 1032) are capacitively coupled higher by the increase in Vch (plot 1035b). The voltages of the word lines float to a peak level of Vwl_coupled_up, as discussed.

Figure 10C:
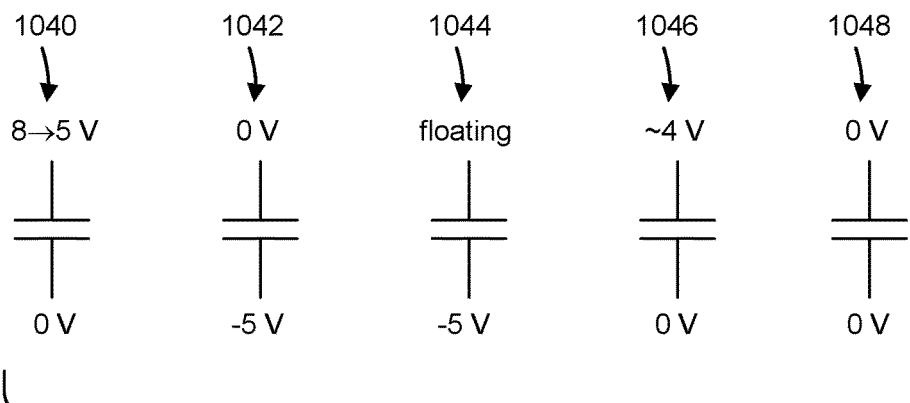
FIG. 10C depicts control gate and channel voltages on a memory cell which acts as a capacitor when the control gate voltage is decreased in a sensing operation.

FIG. 10C depicts control gate and channel voltages on a memory cell which acts as a capacitor when the control gate voltage is decreased in a sensing operation. As mentioned, the top plate represents the control gate or word line and the bottom plate represents the channel. The capacitor 1040 represents a memory cell in the time period of t17-t18 in FIG. 10A1 or t12-t13 in FIG. 10B1, where Vpass=8 V and VvG=5 V. The word line voltage transitions from 8 to 5 V and Vch=0 V. The capacitor 1042 represents a memory cell at t19 in FIG. 10A2 or t14 in FIG. 10B2. Vwl=0 V and Vch=−5 V. The capacitor 1044 represents a memory cell just after t19 in FIG. 10A2 or just after t14 in FIG. 10B2. Vwl floats and Vch=−5 V. The capacitor 1046 represents a memory cell after t20 in FIG. 10A2 or after t15 in FIG. 10B2. Vwl=4 V and Vch=0 V. The capacitor 1048 represents a memory cell after a significant amount of time has passed, e.g., an hour or more. Vwl=0 V and Vch=0 V.

When a data word line voltage floats, the amount of holes needed to charge up the channel is relatively small. As a result, the selected word line can be relatively quickly coupled up to about 4 V, for example. The potential on the selected word line remains at −4 V for a while, attracting electrons trapped in the tunnel oxide-nitride-oxide (ONO) layers and causing a Vth up-shift. If the wait before the next read operation is long enough, the coupled up potential of the word line will be discharged, and the trapped electrons will be de-trapped. The first read situation will occur again, resulting in an elevated number of read errors if a corrective action is not taken, such as periodically applying a dummy voltage which simulates the word line coupling up effects of a sensing operation, and/or adjusting the read voltages.

Figure 10D:
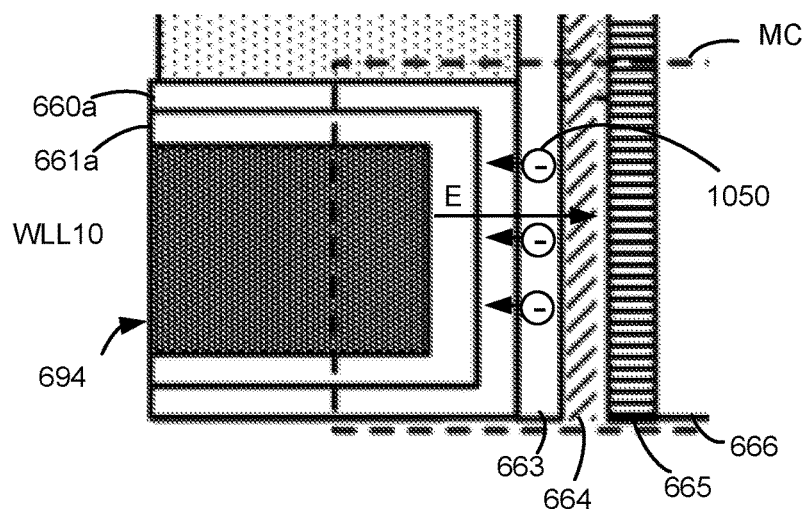
FIG. 10D depicts a portion of the memory cell MC of FIG. 6 showing electron injection into a charge trapping region during weak programming.

FIG. 10D depicts a portion of the memory cell MC of FIG. 6 showing electron injection into a charge trapping region during weak programming. The memory cell includes a control gate 694, a metal barrier 661a, a blocking oxide 660a, a charge-trapping layer 663, a tunneling layer 664, a channel 665 and a dielectric core 666. Due to the elevated word line voltage, an electric field (E) is created which attracts electrons (see example electron 1050) into the charge trapping layer, increasing the Vth. This weak programming may be caused by the Poole-Frenkel effect, in which an electrical insulator can conduct electricity. This is a kind of electron tunneling through traps.

Figure 10E:
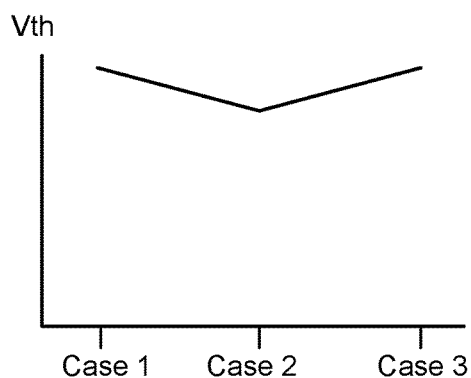
FIG. 10E depicts a plot showing a change in Vth of an example memory cell for three different cases.

FIG. 10E depicts a plot showing a change in Vth of an example memory cell for three different cases. Case 1 represents a normal read situation which occurs shortly after programming for the A state, as an example. In this case, Vth is at a coupled up level. Case 2 represents a first read situation which occurs shortly after the memory device is powered down and then power up, or after a relatively long period since a last sensing operation. In this case, Vth is not at a coupled up level. Recall that when the device is powered on, the word lines may be set to 0 V in a diagnostic process which checks for bad blocks. The non-coupled up Vth may be about 0.1 V (3 sigma value) lower than the coupled up Vth. Case 3 represents a read operation which occurs after a dummy voltage is applied to word lines in a block, as described herein. In this case, Vth is at a coupled up level. This case shows the effectiveness of a dummy voltage, e.g., a dummy read operation, in avoiding the first read situation.

As mentioned, when a read operation occurs right after another sensing operation, a Vth upshift is observed. After waiting for one hour, for instance, and performing another read operation, a Vth downshift is observed. If another read operation occurs right away, a Vth upshift is observed. Since the read levels are decided based on a Vth distribution in a normal read situation, which is the most common situation, an elevated number of read errors is observed in the first read situation.

FIG. 11A depicts a plot of an example dummy voltage of a word line and a subsequent coupled up voltage of the word line. As mentioned, a dummy voltage can be used to avoid the first read situation in which the usual coupling up of the word line voltage is not present. The dummy voltage triggers the coupling up of the word line voltage so that a normal read situation is present when a read command is issued. One option is to apply the dummy read voltage in response to the issuance of a read command from the controller. However, this would result in a time penalty since the read operation would have to wait until the dummy voltage was applied and the word line voltages were coupled up. Another option is to apply the dummy read voltage in response to a specified trigger such as the passage of a specified amount of time, e.g., 1-2 hours, since a last sensing operation. This approach provides a periodic coupling up of Vwl so that a read operation can occur without delay in the normal read situation. Another specified trigger is the detection of a power on event. Other triggers are possible as well. For example, the dummy voltage can be applied when the memory device is in an idle state or when no other tasks with a higher priority are pending.

The magnitude of the dummy voltage, Vdummy, should be at least as high as a highest verify voltage of the different verify voltages used to program memory cells to different data states, in one implementation. For example, for a memory device with four, eight or sixteen states, Vdummy should be at least VvC, VvG or VvS15, respectively. This ensures that the maximum coupling down of Vch and the maximum coupling up of Vwl will occur.

One approach to applying a dummy voltage is to apply the voltage to all data word lines in a block concurrently. Another approach is to apply the voltage to fewer than all data word lines in a block concurrently. When the dummy voltage is applied, in one approach, the bit line voltage Vbl=0 V, and the voltages of the select gate control lines and the dummy word lines is sufficiently high to provide the select gate transistors and the dummy memory cells, respectively, in a conductive state, e.g., so the channel is not cutoff. By applying the dummy voltage at a sufficiently high level and then decreasing it back to 0 V, for instance, the normal read situation is provided before initiating a read operation.

The horizontal axis depicts time and the vertical axis depicts word line voltage, Vwl. A dummy voltage 1100 (e.g., a voltage pulse or waveform) is applied to the word lines in a block from t0-t5 and reaches a magnitude of Vdummy. The voltage includes an increasing portion 1100a, a portion 1100b at Vdummy and a decreasing portion 1100c. Due to an RC time constant of the word lines and the capabilities of the word line driver, the requested voltage is not immediately realized when a voltage driver is commanded to provide the requested voltage. For example, Vint may be requested at t0, Vdummy may be requested at t1 and 0 V may be requested at t3. The voltage drivers may be commanded to no longer provide a voltage at t5 (e.g., to disconnect the voltage drivers from the word lines) to allow the voltages to float. See also FIG. 16.

For example, a control circuit may be configured to command a voltage driver to increase voltages of the word lines from an initial level (e.g., 0 V) to an elevated level (e.g., Vdummy), and then to decrease the voltages of the word lines from the elevated level to a final level (e.g., 0 V). The control circuit, to float the voltages of the word lines, is configured to disconnect the voltage driver from the word lines a specified time (e.g., after a time duration of t5-t3) after requesting that the voltage driver decrease the voltages of the word lines from the elevated level to the final level.

At t4, the voltage falls below VvG so that the memory cells in the G state are made non-conductive state. The remaining transition of the voltage provides capacitive coupling, as discussed. Memory cells in lower states are made non-conductive when the voltage falls lower. Different contributions to the coupling up of a word line can therefore be made by the different cells connected to the word line according to their respective data states. An overall coupled up voltage on the word line will be provided.

As the dummy voltage 1100 decreases from VvG to 0 V, the channel is capacitively coupled down by a similar amount, as represented by a dashed line 1110a in FIG. 11B.

FIG. 11B depicts a plot of a channel voltage which is coupled down from a starting level, e.g., 0 V, and subsequently returns to the starting level, consistent with FIG. 11A. The channel is capacitively coupled down to a minimum level of Vch_min and then begins to return to its starting level from t5-t6. The voltages of the word lines are allowed to float starting at t5, so that the voltages (plot 1102) are capacitively coupled higher by the increase in Vch (plot 1110b). The voltages of the word lines float to a peak level of Vwl_coupled_up.

FIG. 12A depicts a plot corresponding to the plot of FIG. 11A but showing a decay of the coupled up voltage of the word line over a longer time period of e.g., one or more hours. A plot 1200 depicts the dummy voltage (in a time period t0-t1) and a plot 1202 depicts an increase in Vwl due to coupling (in a time period t1-t2) followed by a decay of Vwl (in a time period t2-t3). The increase in Vwl occurs relatively quickly compared to the time period of the decay.

FIG. 12B depicts a plot corresponding to the plot of FIG. 11B but showing the channel voltage over a longer time period, consistent with FIG. 12A. A decrease to Vch_min followed by an increase (plot 1204) occurs in the time period t1-t2.

FIG. 12C depicts a plot of a Vth of a memory cell connected to the coupled up word line, consistent with FIGS. 12A and 12B. For a cell in an example data state, such as the A state, the Vth is at an initial level, Vth_initial, from t0-t1. Vth increases due to coupling at the same time as the increase in Vch, to a peak level of Vth_coupled_up. The Vth then gradually decreases back to Vth_initial.

FIG. 13A depicts a plot corresponding to the plot of FIG. 11A but showing two instances of a dummy voltage of a word line and a subsequent coupled up voltage of the word line. By periodically applying the dummy voltage, some coupling up of the word lines can be maintained. Vwl_coupled_up represents the peak coupled up level and Vwl_coupled_min represents the minimum coupled up level. The dummy voltage is initiated at t0 and t4, so that t440 is a specified time period for initiating the dummy voltage. A plot 1300 depicts the first instance of the dummy voltage (in a time period t0-t1), and a plot 1302 depicts an increase in Vwl due to coupling (in a time period t1-t2) followed by a decay of Vwl (in a time period t2-t3) to Vwl_coupled_min. A plot 1304 depicts the second instance of the dummy voltage (in a time period t4-t5), and a plot 1306 depicts an increase in Vwl due to coupling (in a time period t5-t6) followed by a decay of Vwl (in a time period t6-t7) to Vwl_coupled_min. This sequence can be repeated while the memory device is power on, in one approach.

FIG. 13B depicts a plot showing a channel voltage, consistent with FIG. 13A. A decrease to Vch_min followed by an increase (plot 1310 and 1312) occurs in the time periods t1-t2 and t5-t6, respectively.

FIG. 13C depicts a plot of a Vth of a memory cell connected to the coupled up word line, consistent with FIGS. 13A and 13B. For a cell in an example data state, the Vth is at an initial level, Vth_initial, from t041. The Vth increases due to coupling at the same time as the increase in Vch, to a peak level of Vth_coupled_up. The Vth then gradually decreases back to Vth_coupled_min>Vth_initial at t5 (plot 1320). Subsequently, Vth increases due to coupling at the same time as the increase in Vch, from the intermediate level of Vth_coupled_min to Vth_coupled_up. Vth then gradually decreases back to Vth_coupled_min>Vth_initial at t7 (plot 1322). This cycle of up-coupling and decay can be repeated continuously.

Figure 14A:
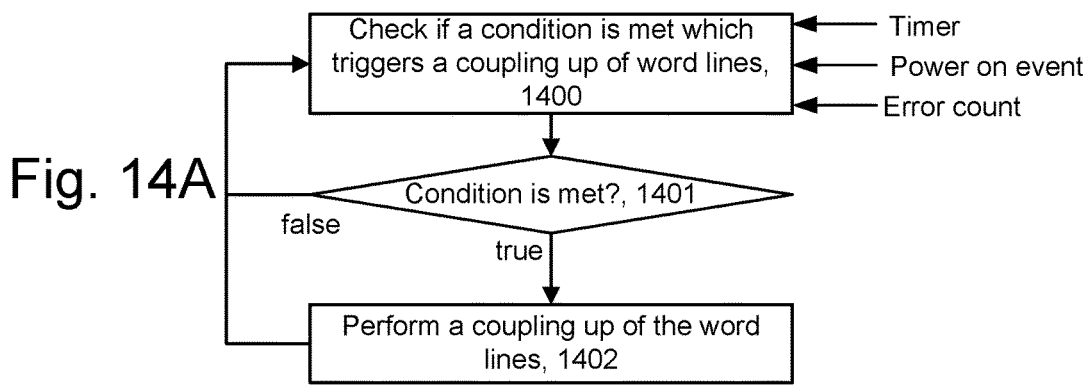
FIG. 14A depicts an example process for deciding when to perform a coupling up of word lines, consistent with FIG. 11A to 13C.

FIG. 14A depicts an example process for deciding when to perform a coupling up of word lines, consistent with FIG. 11A to 13C. Step 1400 involves checking if a condition is met which triggers a coupling up of word lines. For example, this step can be responsive to a timer (e.g., 112a in FIG. 1) which determines whether a specified amount of time has passed since a last sensing operation, e.g., a last program or read operation, an event handler which determines whether a power on event has been detected, or an ECC engine (e.g., 245 in FIG. 1) which provides an error count, where the error count or number of errors in a read operation is compared to a specified number. A decision step 1401 determines whether the condition is met. If decision step 1401 is false, step 1400 is repeated. If decision step 1401 is true, step 1402 performs a coupling up of the word lines such as by applying a dummy voltage, as discussed.

Figure 14B:
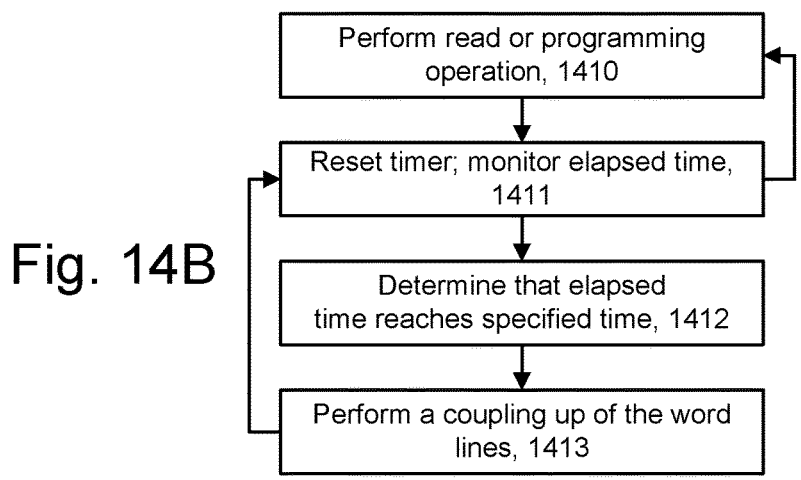
FIG. 14B depicts an example implementation of the process of FIG. 14A where the coupling up of the word lines is triggered when an elapsed time after a program or read operation reaches a specified time.

FIG. 14B depicts an example implementation of the process of FIG. 14A where the coupling up of the word lines is triggered when an elapsed time after a program or read operation reaches a specified time. Step 1410 involves performing a read or programming operation. Step 1411 involves resetting a timer and monitoring an elapsed time. Step 1412 involves determining that an elapsed time reaches a specified time. Step 1413 involves performing a coupling up of the word lines.

Figure 14C:
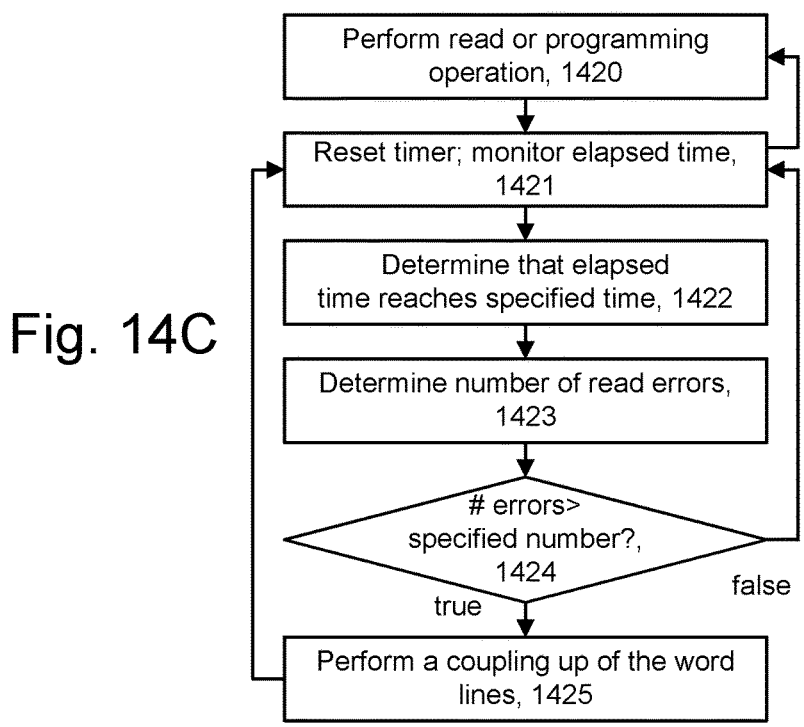
FIG. 14C depicts an example implementation of the process of FIG. 14A where the coupling up of the word lines is triggered when a number of read errors exceeds a specified number.

FIG. 14C depicts an example implementation of the process of FIG. 14A where the coupling up of the word lines is triggered when a number of read errors exceeds a specified number. Step 1420 involves performing a read or programming operation. Step 1421 involves resetting a timer and monitoring an elapsed time. Step 1422 involves determining that an elapsed time reaches a specified time. Step 1423 involves determining a number of read errors. For example, a read operation can be performed for one or more word lines to determine this number. In one approach, the read operation is a partial read operation which does not trigger the word line coupling up. For example, the partial read operation may distinguish between the erased state and the lowest programmed state, e.g., by applying VrA to a word line. This state can be most susceptible to errors. The number of errors in this case is the number of A state cells with Vth<VrA summed with the number of erased state cells with Vth>VrA. Decision step 1424 determines whether the number of read errors is greater than a specified number. If this is true, step 1425 involves performing a coupling up of the word lines. If decision step is false, step 1421 is repeated, where the time is reset. As an example, a partial read operation can be performed every hour to decide whether a coupling up of the word lines is indicated.

Figure 14D:
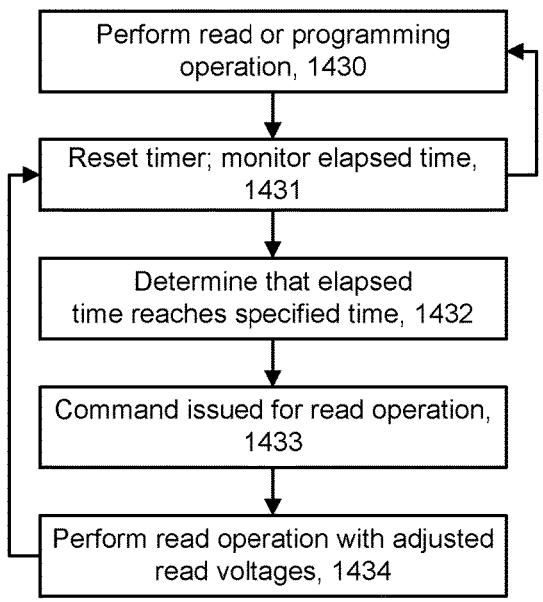
FIG. 14D depicts another example implementation of the process of FIG. 14A, where adjusted voltages are used in a read operation after the passage of a specified time period.

FIG. 14D depicts another example implementation of the process of FIG. 14A, where adjusted voltages are used in a read operation after the passage of a specified time period. Step 1430 involves performing a read or programming operation. Step 1431 involves resetting a timer and monitoring an elapsed time. Subsequently, one of two paths can be followed. In a first path, a next read or programming operation is performed at step 1430, before the elapsed time reaches a specified time. In a second path, step 1432 determines that the elapsed time reaches a specified time. Subsequently, a command is issued for a read operation at step 1433. In response to the command, step 1434 involves performing a read operation with adjusted read voltages as discussed, e.g., in connection with FIG. 8A-8C.

In one approach, a read command is made by a host device and transmitted to the external controller 122 of FIG. 1. The external controller in turn instructs the control circuitry 110 to perform the read operation.

Figure 14E:
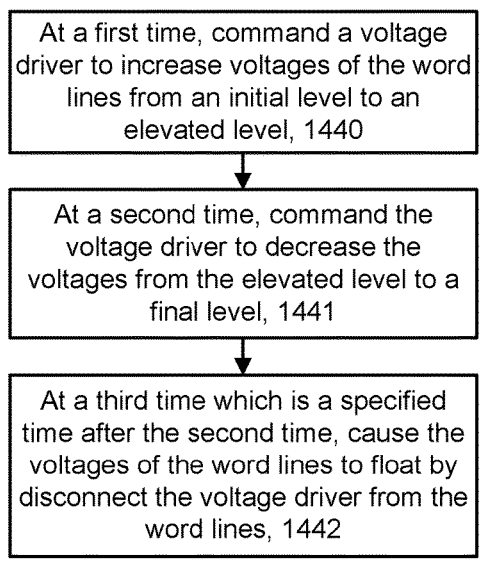
FIG. 14E depicts an example process for performing a coupling up of word lines, consistent with step 1402 of FIG. 14A.

FIG. 14E depicts an example process for performing a coupling up of word lines, consistent with step 1402 of FIG. 14A. At step 1440, at a first time (e.g., t0 in FIG. 11A), a voltage driver is commanded to increase voltages of the word lines in a block from an initial level (e.g., 0 V) to an elevated level (Vdummy). The voltages are then maintained at the elevated level for a specified time, e.g., until t3 in FIG. 11A. As mentioned, the magnitude of Vdummy may be at least as high as a highest verify voltage of the one or more programmed states. The highest verify level can differ according to a mode in which the memory device operates. For example, assume a memory device can operate in a two state, four state, eight state or sixteen state mode, where the highest verify level is VvSLC, VvC, VvG and VvS15, respectively. These levels can differ from one another. Power can be saved by setting Vdummy at a level which is based on the highest verify level of the current mode. In one implementation, the control circuit is configured to program the memory cells in a selected mode of a plurality of modes, where each mode has a different number of data states, and to set magnitudes of the dummy voltage pulses based on the selected mode.

At step 1441, at a subsequent second time, e.g., t3 in FIG. 11A, the voltage driver is commanded to decrease voltages from the elevated level to a final level, e.g., 0 V. This request can be for a step change or a gradual ramp decrease, for instance. Step 1442, at a third time which is a specified time after the second time, includes causing the word line voltages to float by disconnecting the voltage driver from the word lines. See also FIG. 16.

Figure 15:
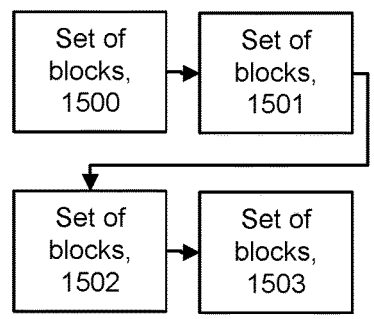
FIG. 15 depicts an example sequence for performing a coupling up of word lines in different sets of blocks.

FIG. 15 depicts an example sequence for performing a coupling up of word lines in different sets of blocks. A memory device can include a large number of blocks so that the voltage drivers are not capable of driving all of them at the same time with the dummy voltage. One solution is to apply the dummy voltage to one or more blocks at a time. This helps save power and avoids an overload of the voltage drivers.

In one approach, a block of memory cells is among a plurality of blocks of memory cells, the memory cells in each block are arranged in strings and connected to a set of word lines, and a control circuit is configured to perform a coupling up of the word lines in each block sequentially, one or more blocks at a time, if a condition has been met for one or more of the blocks. In this case, example sets of blocks 1500, 1501, 1502 and 1503 are provided and the dummy voltages are applied in the order depicted (e.g., blocks 1500 first, then blocks 1501, then blocks 1502 and finally blocks 1503).

Figure 16:
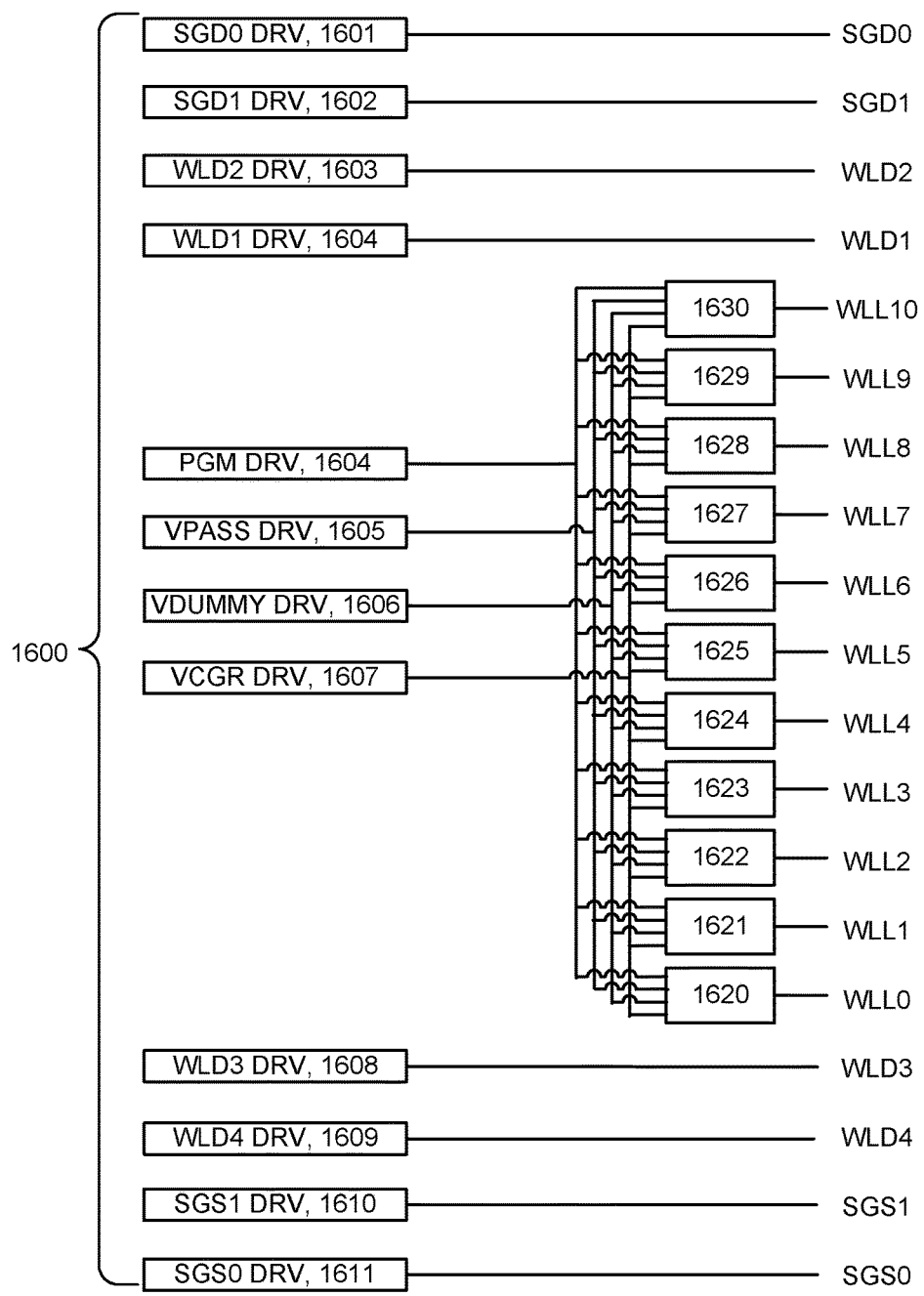
FIG. 16 depicts an example circuit which applies voltages to word lines and select gate lines in a block.

FIG. 16 depicts an example circuit which applies voltages to word lines and select gate lines in a block. The various voltage drivers 1600, such as charge pumps, may be provided as part of the power control module 116 of FIG. 1, for example. An SGD0 driver 1601 (DRV denotes driver) provides a voltage to an SGD0 control line. An SGD1 driver 1602 provides a voltage to an SGD1 control line. A WLD2 driver 1603 provides a voltage to a WLD2 word line. A WLD1 driver 1604 provides a voltage to a WLD1 word line. A PGM driver 1604 provides a voltage to any of the data word lines WLL0-WLL10 which is selected for programming. A VPASS driver 1605 provides a voltage to any of the data word lines WLL0-WLL10 which are not selected for programming or reading. A VDUMMY driver 1606 provides a dummy voltage as described herein to any one or more of the data word lines WLL0-WLL10 to couple up the word line voltages. A VCGR driver 1607 provides a voltage to any of the data word lines WLL0-WLL10 which is selected for reading. A WLD3 driver 1608 provides a voltage to a WLD3 word line. A WLD4 driver 1609 provides a voltage to a WLD4 word line. An SGS1 driver 1610 provides a voltage to an SGS1 control line. An SGS0 driver 1611 provides a voltage to an SGS0 control line.

A set of switches 1620-1630 are responsive to control signals to pass the voltage from one of the drivers 1604-1607 to the respective data word line. Switches 1620, 1621, 1622, 1623, 1624, 1625, 1626, 1627, 1628, 1629 and 1630 are used for word lines WLL0-WLL10, respectively.

The switches 1620-1630 can also be controlled to disconnect a driver from the respective data word line. For example, the VDUMMY driver 1606 can be disconnected to float the voltages of the data word lines as discussed to allow coupling up of the voltages.

In this approach, the data word lines receive the same voltage, Vdummy, from the VDUMMY driver. However, other approaches are possible which allow different data word lines to receive different dummy voltages. For example, in a 3D memory device in which strings of cells extend vertically, Vdummy may be adjusted based on the pillar or memory hole diameter so that Vdummy is relatively smaller when the diameter/width is relatively smaller. This accounts for an increased amount of coupling when the diameter/width is relatively smaller. As mentioned in connection with FIG. 5, with a relatively smaller diameter portion of a memory hole, the electric field across the tunnel oxide is relatively stronger, so that the programming and erase speed is higher. Similarly, coupling up due to the weal programming caused by the dummy voltage will be stronger. Adjusting Vdummy based on the pillar or memory hole diameter helps even out the amount of coupling up and the associated weak programming across the word line layers in the stack. This results in consistent Vth levels across the word line layers.

The word lines may be divided into groups which have a similar diameter and a separate DUMMY driver provided for each group. It is also possible to provide a separate DUMMY driver for each word line.

In one implementation, the word lines comprise conductive layers separated by dielectric layers in a stack, the memory cells are arranged along vertical pillars in the stack, the vertical pillars have widths which increase progressively with a height of the stack, and a control circuit is configured to set magnitudes of the voltage pulses for the word lines so that a relatively higher magnitude is set for word lines relatively higher in the stack and a relatively lower magnitude is set for word lines relatively lower in the stack.

Accordingly, it can be seen that, in one embodiment, an apparatus comprises a block of memory cells, the memory cells are arranged in strings and connected to a set of word lines; and a control circuit. The control circuit is configured to determine if a condition has been met to trigger a coupling up of the word lines, and to perform a coupling up of the word lines if the condition has been met, wherein to perform the coupling up of the word lines, the control circuit is configured to apply a voltage pulse to each word line and subsequently float a voltage of each word line.

In another embodiment, a method comprises determining if a condition has been met to apply a dummy voltage to word lines in a block of memory cells, wherein the memory cells are arranged in strings and connected to the word lines; and if the condition has been met, increasing a voltage of the word lines to an elevated level, followed by decreasing a voltage of the word lines from the elevated level to a final level, followed by allowing voltages of the word lines to float.

In another embodiment, an apparatus comprises means for determining, in response to a read command for a set of memory cells, if a time since a last sensing operation of the memory cells exceeds a specified time; means for reading the set of memory cells using a baseline set of read voltages if the time since the last sensing operation of the memory cells does not exceed the specified time; and means for reading the set of memory cells using an adjusted set of read voltages if the time since the last sensing operation of the memory cells exceeds the specified time.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    a block of memory cells, the memory cells connected to a set of word lines; and
    a control circuit, the control circuit configured to make a determination that voltages of the word lines float below an elevated level, and to increase the voltages of the word lines in response to the determination that the voltages of the word lines float below the elevated level, wherein to increase the voltages of the word lines, the control circuit is configured to cause a voltage driver to apply a voltage pulse to each word line of the set of word lines.

2. The apparatus of claim 1, wherein:
    the memory cells are not sensed during the voltage pulses.

3. The apparatus of claim 1, wherein:
    the control circuit is configured to cause the voltage driver to apply the voltage pulse when a read command is not pending for the block.

4. The apparatus of claim 1, wherein:
    the memory cells are programed to different data states using different verify voltages; and
    a magnitude of the voltage pulses is at least as high as a highest verify voltage of the different verify voltages.

5. The apparatus of claim 1, wherein:
    the control circuit, to cause the voltage driver to apply the voltages pulses, is configured to command the voltage driver to increase the voltages of the word lines from an initial level to an elevated level, and then to decrease the voltages of the word lines from the elevated level to a final level; and
    the control circuit is configured to disconnect the voltage driver from the word lines a specified time after commanding the voltage driver to decrease the voltages of the word lines from the elevated level to the final level.

6. The apparatus of claim 1, wherein:
    the memory cells are programed to different data states comprising one or more lower data states, one or more midrange data states and one or more upper data states; and
    the control circuit is configured to use an adjusted set of read voltages to read the memory cells in response to the determination that the voltages of the word line float below the elevated level; and in the adjusted set of read voltages, read voltages for the one or more lower data states are lower than in a baseline set of read voltages, and read voltages for the one or more upper data states are higher than in the baseline set of read voltages.

7. The apparatus of claim 1, wherein:
the control circuit, to make the determination that the voltages of the word lines float below the elevated level, is configured to determine when a time since a last sensing operation of the memory cells exceeds a specified time.

8. The apparatus of claim 1, wherein:
the control circuit, to make the determination that the voltages of the word lines float below the elevated level, is configured to determine when a power on event is detected.

9. The apparatus of claim 1, wherein:
the control circuit, to make the determination that the voltages of the word lines float below the elevated level, is configured to determine when a number of errors in a read operation for at least a subset of the memory cells exceeds a specified number.

10. The apparatus of claim 1, wherein:
the control circuit, to make the determination that the voltages of the word lines float below the elevated level, is configured to determine when the control circuit enters an idle state.

11. The apparatus of claim 1, wherein:
the word lines comprise conductive layers separated by dielectric layers in a stack;
the memory cells are arranged along vertical pillars in the stack;
the vertical pillars have widths which increase progressively with a height of the stack; and
the control circuit is configured to set magnitudes of the voltage pulses for the word lines so that a relatively higher magnitude is set for word lines relatively higher in the stack and a relatively lower magnitude is set for word lines relatively lower in the stack.

12. The apparatus of claim 1, wherein:
the control circuit is configured to program the memory cells in a selected mode of a plurality of modes, each mode has a different number of data states, and to set magnitudes of the voltage pulses based on the selected mode.

13. The apparatus of claim 1, wherein:
the block of memory cells is among a plurality of blocks of memory cells;
the memory cells in each block are arranged in strings and connected to a set of word lines; and
the control circuit is configured to perform the increase of the voltages of the word lines in each block one or more blocks at a time, in response to the determination that the voltages of the word lines float below the elevated level for one or more of the blocks.

14. The apparatus of claim 1, wherein:
the control circuit is configured to periodically trigger the increase of the voltages of the word lines.

15. The apparatus of claim 1, wherein:
the block of memory cells is in one set of blocks of memory cells; and
the control circuit is configured to perform an increase of the voltages of word lines concurrently in each block of memory cells of the one set of blocks of memory cells.

16. The apparatus of claim 15, wherein:
the control circuit is configured to perform an increase of the voltages of word lines concurrently in each block of memory cells of another set of blocks of memory cells after the increase of the voltages of the word lines in each block of memory cells of the one set of blocks of memory cells.

17. The apparatus of claim 1, wherein:
the control circuit and the block of memory cells are on a die.

18. The apparatus of claim 1, wherein:
the block of memory cells is on a die; and
the control circuit is external to the die.

19. The apparatus of claim 1, wherein:
the control circuit is configured to increase the voltages of the word lines when a read command is issued for the block of memory cells.

20. The apparatus of claim 1, wherein:
to control circuit, to increase the voltages of the word lines, is configured to disconnect the voltage driver from each word line after causing the voltage driver to apply the voltage pulse to each word line.

21. A method, comprising:
determining when a condition is met to increase voltages of word lines in a block of memory cells, wherein the memory cells are connected to the word lines; and
when the condition is met, increasing the voltages of the word lines by capacitive coupling, the increasing the voltages of the word lines by capacitive coupling comprises, using a voltage driver, increasing a voltage of the word lines to an elevated level, followed by decreasing a voltage of the word lines from the elevated level to a final level, followed by disconnecting the voltage driver from the word lines.

22. The method of claim 14, wherein:
the memory cells comprise channels; and
the increasing of the voltages of the word lines by capacitive coupling comprises capacitive coupling from the channels to the word lines.

23. The method of claim 21, wherein:
the condition is met when a time since a last sensing operation of the memory cells exceeds a specified time.

24. An apparatus, comprising:
means for determining, in response to a read command for a set of memory cells, if a time since a last sensing operation of the memory cells exceeds a specified time;
means for reading the set of memory cells using a baseline set of read voltages if the time since the last sensing operation of the memory cells does not exceed the specified time; and
means for reading the set of memory cells using an adjusted set of read voltages if the time since the last sensing operation of the memory cells exceeds the specified time.

25. The apparatus of claim 24, wherein:
the memory cells are programed to different data states comprising one or more lower data states, one or more midrange data states and one or more upper data states; and
in the adjusted set of read voltages, read voltages for the one or more lower data states are lower than in the baseline set of read voltages, and read voltages for the one or more upper data states are higher than in the baseline set of read voltages.

26. The apparatus of claim 25, wherein:
the different data states comprise multiple lower data states and multiple upper data states; and
read voltages for the multiple lower data states are adjusted lower than in the baseline set of read voltages by different amounts, wherein a largest adjustment among the read voltages for the multiple lower data states is provided for a lowest data state of the multiple lower data states.

27. The method of claim 21, wherein:
the capacitive coupling occurs when the voltage driver is disconnected from the word lines.

28. An apparatus, comprising:
a block of memory cells, the memory cells connected to a set of word lines; and
a control circuit, the control circuit configured to determine when voltages of the word lines decay from a coupled up situation to a first read situation, and to increase the voltages of the word lines in response to the determining when the voltages of the word lines decay from the coupled up situation to the first read situation, wherein to increase the voltages of the word lines, the control circuit is configured to cause a voltage driver to apply a voltage pulse to each word line of the set of word lines.

29. The apparatus of claim 28, wherein:
the first read situation comprises a non-coupled up situation for the word lines.

* * * * *